United States Patent
Jeong et al.

(10) Patent No.: US 12,417,815 B2
(45) Date of Patent: Sep. 16, 2025

(54) MEMORY DEVICE INCLUDING ERROR CORRECTION DEVICE

(71) Applicant: SK hynix Inc., Gyeonggi-do (KR)

(72) Inventors: Jin Ho Jeong, Gyeonggi-do (KR); Dae Suk Kim, Gyeonggi-do (KR); Sang Woo Yoon, Gyeonggi-do (KR); A Ram Rim, Gyeonggi-do (KR); Mun Seon Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 302 days.

(21) Appl. No.: 18/314,147

(22) Filed: May 9, 2023

(65) Prior Publication Data

US 2024/0177793 A1 May 30, 2024

(30) Foreign Application Priority Data

Nov. 25, 2022 (KR) ........................ 10-2022-0160360

(51) Int. Cl.
*G11C 29/44* (2006.01)
*G11C 29/00* (2006.01)
*G11C 29/52* (2006.01)

(52) U.S. Cl.
CPC .............. *G11C 29/52* (2013.01); *G11C 29/44* (2013.01); *G11C 29/789* (2013.01)

(58) Field of Classification Search
CPC ....... G11C 29/52; G11C 29/44; G11C 29/789; G11C 29/72; G11C 29/846; G11C 29/848; G11C 29/74; G11C 29/42; G11C 29/76; G11C 29/808; G06F 11/1048; G06F 30/32

See application file for complete search history.

(56) References Cited

U.S. PATENT DOCUMENTS

| | | | | |
|---|---|---|---|---|
| 2014/0169092 A1* | 6/2014 | Miyamoto | .......... | G06F 11/1048 365/185.05 |
| 2017/0091027 A1* | 3/2017 | Sohn | .................. | G11C 29/4401 |
| 2020/0183781 A1 | 6/2020 | Nakai | | |
| 2020/0365226 A1* | 11/2020 | Ryu | .................... | G06F 13/4022 |

FOREIGN PATENT DOCUMENTS

KR 10-2018-0059149 A 6/2018

* cited by examiner

*Primary Examiner* — Mohammed A Bashar
(74) *Attorney, Agent, or Firm* — IP & T GROUP LLP

(57) ABSTRACT

A memory device includes a memory cell area including a plurality of cell blocks divided into a plurality of normal cell blocks, at least one ECC cell block, and at least one redundancy cell block, the plurality of cell blocks being configured to output data and error correction codes; an error correction circuit configured to generate error-corrected data by correcting errors in the data using the error correction codes; a first switch group configured to output the error-corrected data while performing, according to first repair control information, a shifting operation on the error-corrected data; and a second switch group configured to transfer the data from the memory cell area to the error correction circuit while performing, according to second repair control information, a zero-padding operation on the data output from one of the cell blocks.

24 Claims, 27 Drawing Sheets

FIG. 6B

| REPAIR INFO. | MB0 (HIT0) | MB1 (HIT1) | MB2 (HIT2) | MB3 (HIT3) | MB4 (HIT4) | MB5 (HIT5) | MB6 (HIT6) | MB7 (HIT7) | MBECC (HIT8) | MB8 (HIT9) | MB9 (HIT10) | MB10 (HIT11) | MB11 (HIT12) | MB12 (HIT13) | MB13 (HIT14) | MB14 (HIT15) | MB15 (HIT16) | NO REPAIR |
|---|---|---|---|---|---|---|---|---|---|---|---|---|---|---|---|---|---|---|
| C_REP3 | 1 | 1 | 1 | 1 | 1 | 1 | 1 | 1 | 1 | 0 | 0 | 0 | 0 | 0 | 0 | 0 | 0 | 0 |
| C_REP2 <0:16> | 1000 | 0100 | 0010 | 0001 | 0000 | 0000 | 0000 | 0000 | 0000 | 0000 | 0000 | 0000 | 0000 | 0000 | 0000 | 0000 | 0000 | 0000 |
|  | 0000 | 0000 | 0000 | 0000 | 1000 | 0100 | 0010 | 0001 | 0000 | 0000 | 0000 | 0000 | 0000 | 0000 | 0000 | 0000 | 0000 | 0000 |
|  | 0000 | 0000 | 0000 | 0000 | 0000 | 0000 | 0000 | 0000 | 1000 | 1000 | 0100 | 0010 | 0001 | 1000 | 0100 | 0010 | 0001 | 0000 |
|  | 0 | 0 | 0 | 0 | 0 | 0 | 0 | 0 | 0 | 0 | 0 | 0 | 0 | 0 | 0 | 0 | 0 | 1 |
| C_REP1 <0:15> | 1111 | 0111 | 0011 | 0001 | 0000 | 0000 | 0000 | 0000 | 0000 | 0000 | 0000 | 0000 | 0000 | 0000 | 0000 | 0000 | 0000 | 0000 |
|  | 1111 | 1111 | 1111 | 1111 | 1111 | 0111 | 0011 | 0001 | 0000 | 0000 | 0000 | 0000 | 0000 | 0000 | 0000 | 0000 | 0000 | 0000 |
|  | 1111 | 1111 | 1111 | 1111 | 1111 | 1111 | 1111 | 1111 | 1111 | 1111 | 0111 | 0011 | 0001 | 0000 | 0100 | 0011 | 0001 | 0000 |

FIG. 13C

| REPAIR INFO. | MB0 (HIT0) | MB1 (HIT1) | MB2 (HIT2) | MB3 (HIT3) | MB4 (HIT4) | MB5 (HIT5) | MB6 (HIT6) | MB7 (HIT7) | MBECC (HIT8) | MB8 (HIT9) | MB9 (HIT10) | MB10 (HIT11) | MB11 (HIT12) | MB12 (HIT13) | MB13 (HIT14) | MB14 (HIT15) | MB15 (HIT16) | NO REPAIR |
|---|---|---|---|---|---|---|---|---|---|---|---|---|---|---|---|---|---|---|
| C_REP3 | 0 | 0 | 0 | 0 | 0 | 0 | 0 | 0 | 1 | 0 | 0 | 0 | 0 | 0 | 0 | 0 | 0 | 0 |
| C_REP2 <0:16> | 1000 | 0100 | 0010 | 0001 | 0000 | 0000 | 0000 | 0000 | 0000 | 0000 | 0000 | 0000 | 0000 | 0000 | 0000 | 0000 | 0000 | 0000 |
|  | 0000 | 0000 | 0000 | 0000 | 1000 | 0100 | 0010 | 0001 | 0000 | 0000 | 0000 | 0000 | 0000 | 0000 | 0000 | 0000 | 0000 | 0000 |
|  | 0000 | 0000 | 0000 | 0000 | 0000 | 0000 | 0000 | 0000 | 1000 | 1000 | 0100 | 0010 | 0001 | 1000 | 0000 | 0010 | 0001 | 0000 |
|  | 0 | 0 | 0 | 0 | 0 | 0 | 0 | 0 | 0 | 0 | 0 | 0 | 0 | 0 | 0 | 0 | 0 | 1 |
| C_REP1 <0:15> | 1111 | 0111 | 0011 | 0001 | 0000 | 0000 | 0000 | 0000 | 0000 | 0000 | 0000 | 0000 | 0000 | 0000 | 0000 | 0000 | 0000 | 0000 |
|  | 1111 | 1111 | 1111 | 1111 | 1111 | 0111 | 0011 | 0001 | 0000 | 0000 | 0000 | 0000 | 0001 | 0000 | 0000 | 0000 | 0000 | 0000 |
|  | 1111 | 1111 | 1111 | 1111 | 1111 | 1111 | 1111 | 1111 | 1111 | 1111 | 0111 | 0011 | 0001 | 1111 | 0100 | 0011 | 0001 | 0000 |

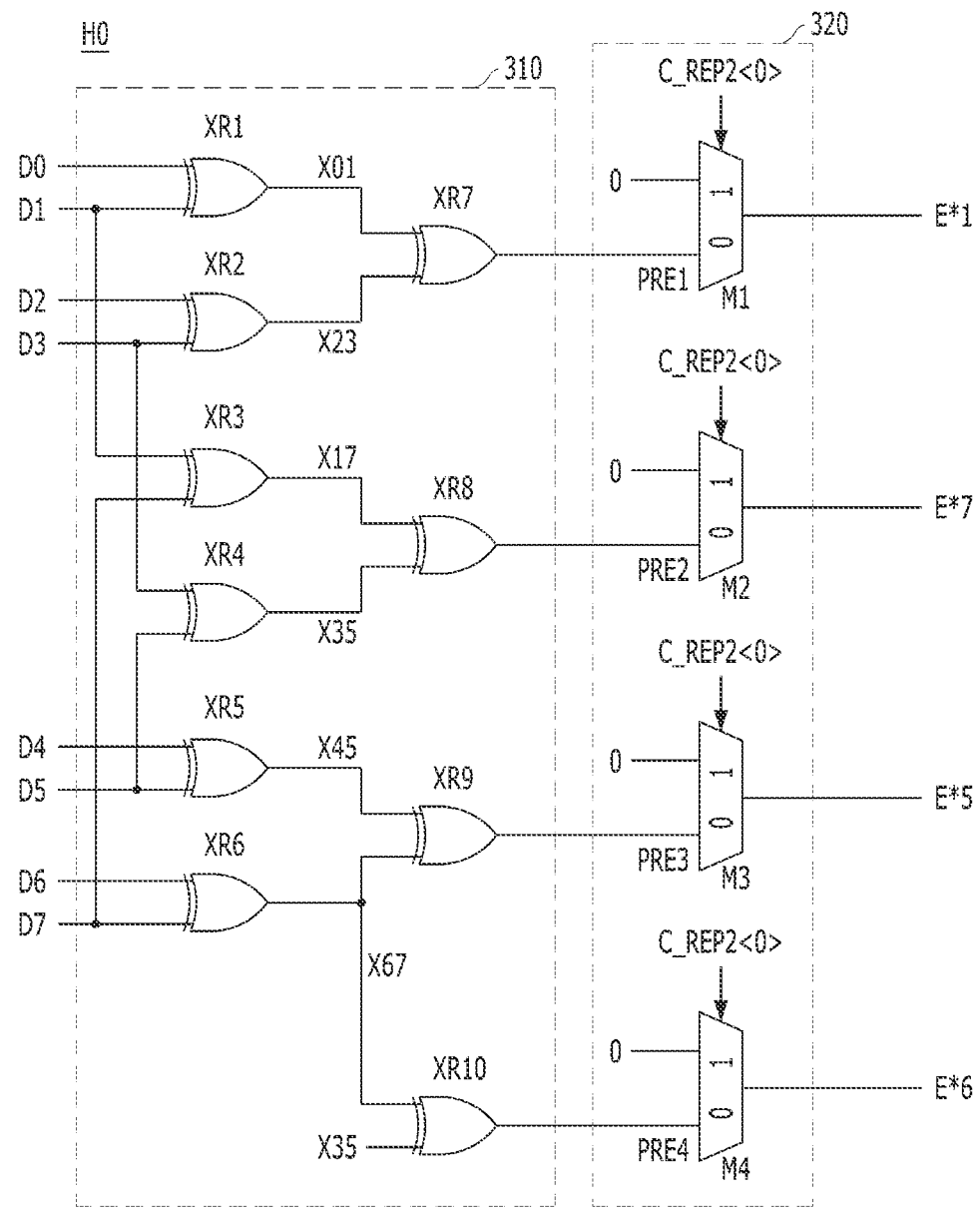

MEMORY DEVICE INCLUDING ERROR CORRECTION DEVICE

CROSS-REFERENCE TO RELATED APPLICATION

The present application claims priority under 35 U.S.C. § 119(a) to Korean Patent Application No. 10-2022-0160360, filed on Nov. 25, 2022, which is incorporated herein by reference in its entirety.

BACKGROUND

1. Field

Various embodiments of the present invention relate to a semiconductor design technology, and more particularly, to a memory device including a memory cell array including a redundancy cell block and an error correction code (ECC) cell block.

2. Description of the Related Art

In the early stage of a semiconductor memory industry, memory chips were produced with no defective memory cells through a semiconductor fabrication process. However, as the capacity of memory devices increases, it becomes difficult to fabricate a memory device having no defective memory cell. Currently, there is substantially no chance that a memory device can be fabricated without any defective memory cells. To address this issue, a repair method of replacing defective memory cells with redundant memory cells, or an error correcting method for correcting errors in a memory device using an error correction circuit is being used.

SUMMARY

Embodiments of the present invention are directed to a memory device capable of managing a miscorrection of an error correction device due to a defective sub-word line driver during a shifting operation for column repair, within a set specification range.

According to an embodiment of the present invention, a memory device includes a memory cell area including a plurality of cell blocks divided into a plurality of normal cell blocks, at least one ECC cell block, and at least one redundancy cell block, the plurality of cell blocks being configured to output data and error correction codes; an error correction circuit configured to generate error-corrected data by correcting errors in the data using the error correction codes; a first switch group configured to output the error-corrected data while performing, according to first repair control information, a shifting operation on the error-corrected data; and a second switch group configured to transfer the data from the memory cell area to the error correction circuit while performing, according to second repair control information, a zero-padding operation on the data output from one of the cell blocks.

According to an embodiment of the present invention, a memory device includes a memory cell area including a plurality of cell blocks divided into a plurality of normal cell blocks, at least one error correction code (ECC) cell block, and at least one redundancy cell block, the plurality of cell blocks being configured to output data and error correction codes; an error correction circuit including a plurality of code calculation circuits corresponding to the cell blocks and configured to generate error-corrected data by correcting errors in the data using the error correction codes while performing, according to second repair control information, a zero-padding operation on a result of calculating on a part of the data by any one of the code calculation circuits; and a first switch group configured to output the error-corrected data while performing, according to first repair control information, a shifting operation on the error-corrected data.

According to an embodiment of the present invention, a memory device includes memory blocks arranged in a row and configured to store therein a zero-padded data piece, user data pieces and an error correction code (ECC) data piece, the zero-padded data piece being stored in a column-repaired one of the memory blocks and one of the user data pieces corresponding to the column-repaired memory block; a swapping circuit configured to swap, with each other, the ECC data piece and the user data piece from neighboring two among the memory blocks; a zero-padding circuit configured to generate a zero-padded data piece for the zero-padded data piece from the column-repaired memory block; an error-correcting circuit configured to error-correct, based on the ECC data piece from the swapping circuit, the zero-padded data piece from the zero-padding circuit and the user data pieces from the memory blocks and the swapping circuit; and a shifting circuit configured to output the error-corrected user data pieces by shifting the error-corrected user data pieces from the error-correcting circuit.

The shifting circuit may be further configured to receive user data pieces from an external device to shift the received user data pieces, the zero-padding circuit may be further configured to generate a zero-padded data piece to be stored in the column-repaired memory block, the error-correcting circuit may be further configured to generate an ECC data piece for the generated zero-padded data piece and the shifted user data pieces, the swapping circuit may be further configured to swap, with each other, the generated ECC data piece and the shifted user data piece to be stored in the neighboring memory blocks, and the memory blocks may be further configured to store therein the generated zero-padded data piece, the shifted user data pieces and the swapped data pieces.

According to an embodiment of the present invention, a memory device includes a shifting circuit configured to receive user data pieces from an external device to shift the user data pieces; a zero-padding circuit configured to generate a zero-padded data piece; an error-correcting circuit configured to generate an error correction code (ECC) data piece for the zero-padded data piece and the shifted user data pieces; a swapping circuit configured to swap, with each other, the ECC data piece and the shifted user data piece to be stored in neighboring two among memory blocks; and the memory blocks arranged in a row and configured to store therein the zero-padded data piece, the shifted user data pieces and the ECC data piece, the memory blocks including a column-repaired memory block that the zero-padded data piece is to be stored in and a redundancy memory block that one of the shifted user data pieces corresponding to the column-repaired memory block is to be stored in.

According to the embodiments of the present invention, the memory device may manage the error correction within a set range and maximize the error correction ability by performing the shifting operation for column repair after performing a zero-padding-based error correction.

BRIEF DESCRIPTION OF THE DRAWINGS

FIGS. 6A and 6B are a block diagram and a table illustrating an information generation circuit of FIG. 5 according to an embodiment of the present invention.

FIGS. 13A to 13C are diagrams illustrating a modified example of the memory device of FIGS. 8A and 8B according to an embodiment of the present invention.

FIG. 16 is a circuit diagram for describing any one code calculation circuit of FIG. 15 according to an embodiment of the present invention.

DETAILED DESCRIPTION

Figure 1:
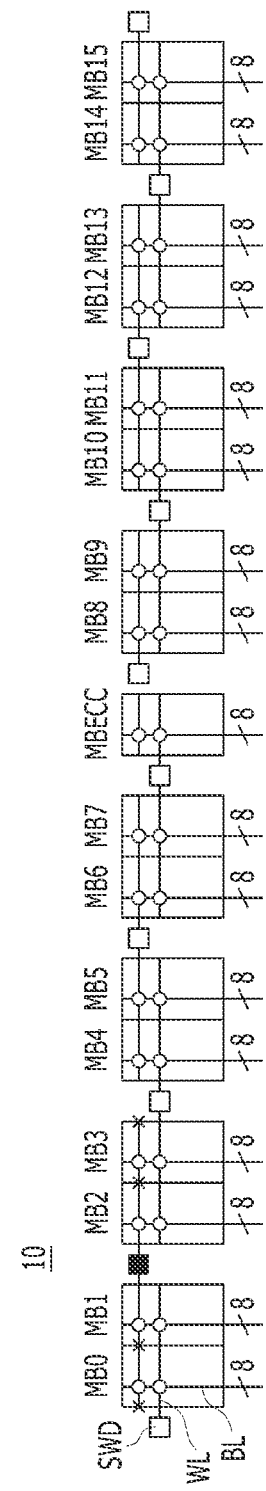
FIG. 1 is a block diagram illustrating cell blocks included in a memory device.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

FIG. 1 is a block diagram illustrating cell blocks included in a memory device 10.

Referring to FIG. 1, the memory device 10 may include a plurality of cell blocks arranged in a row direction. The plurality of cell blocks may include a plurality of normal cell blocks MB0 to MB15 and an error correction code (ECC) cell block MBECC. Each cell block may include a plurality of memory cells connected between a plurality of word lines WL and a plurality of bit lines BL. For reference, the memory device 10 of FIG. 1 shows a case where data is input/output in 8-bit units for each cell block during a single write and read operation. That is, the memory device 10 of FIG. 1 may input/output 128-bit data and use an 8-bit error correction code ECC.

Rectangles between the cell blocks MB0 to MB15, and MBECC may represent sub-word line drivers SWD, and lines extending left and right of the sub-word line drivers SWD may represent word lines (or sub-word lines, WL). In reality, there are far more sub-word line drivers and word lines, but only a few are shown here to represent a simple structure. Since adjacent cell regions among the cell blocks MB0 to MB15, and MBECC share sub-word line drivers, when a defect occurs in the sub-word line driver, an error is likely to occur in cell blocks at both sides of the sub-word line driver. For example, since the second normal cell block MB1 and the third normal cell block MB2 share a sub-word line driver, errors may occur simultaneously in the first to fourth normal cell blocks MB0 to MB3 when a defect occurs in the shared sub-word line driver.

Meanwhile, a memory device such as DRAM may additionally include at least one redundancy cell block to repair column defects in addition to the normal cell blocks MB0 to MB15 and the ECC cell block MBECC. In this case, when a column of a specific normal cell block is repaired, the redundancy cell block may be selected instead of the repaired normal cell block indicated when accessing the repaired column. In this case, due to a physical distance between the repaired cell block and the redundancy cell block, a shifting operation is performed to replace all cell blocks in a direction to the redundancy cell block from the repaired cell block respectively with adjacent cell blocks. Due to the shifting operation and the defective sub-word line driver, a miscorrection of an error correction device may occur to cause errors, an amount of which exceeds a predetermined range, i.e., the error correction capability of the controller. Due to the miscorrection of the error correction device, which is caused by the shifting operation and the defective sub-word line driver, the controller may not be able to error-correct the data output from the memory device 10.

Figure 2A:
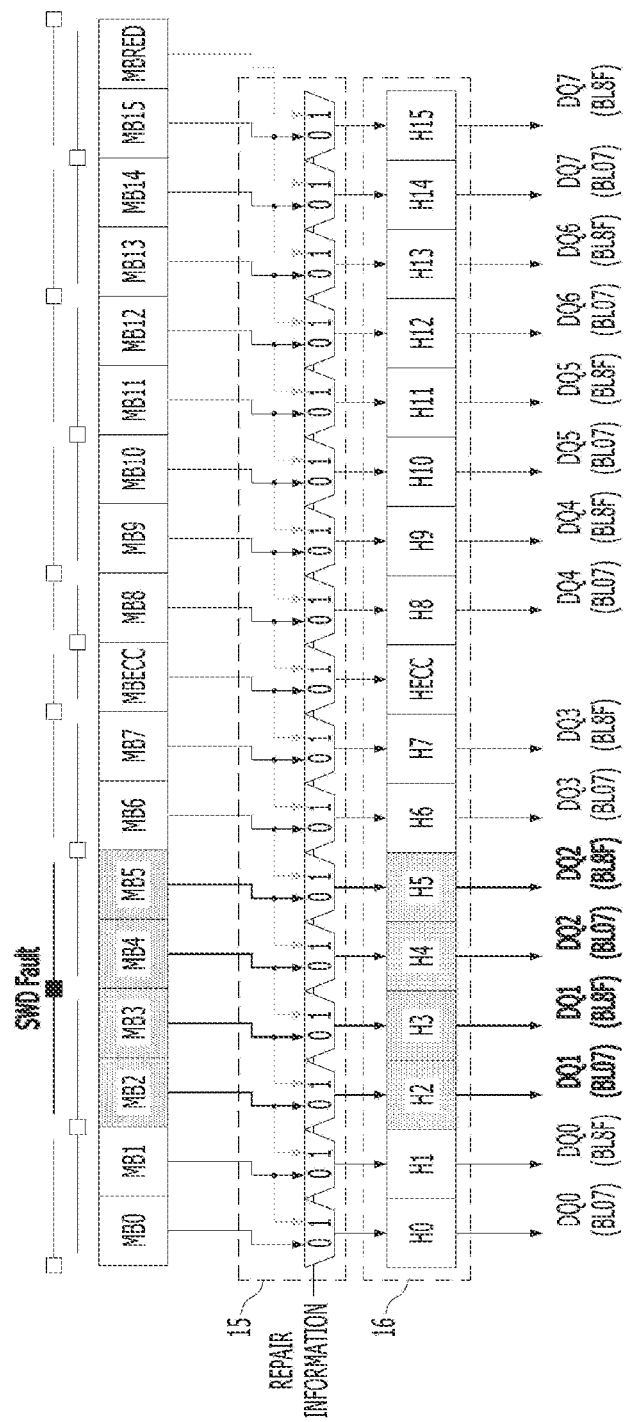
FIGS. 2A and 2B are diagrams for describing a miscorrection of an error correction device due to a defect in a sub-word line driver.
Figure 2B:
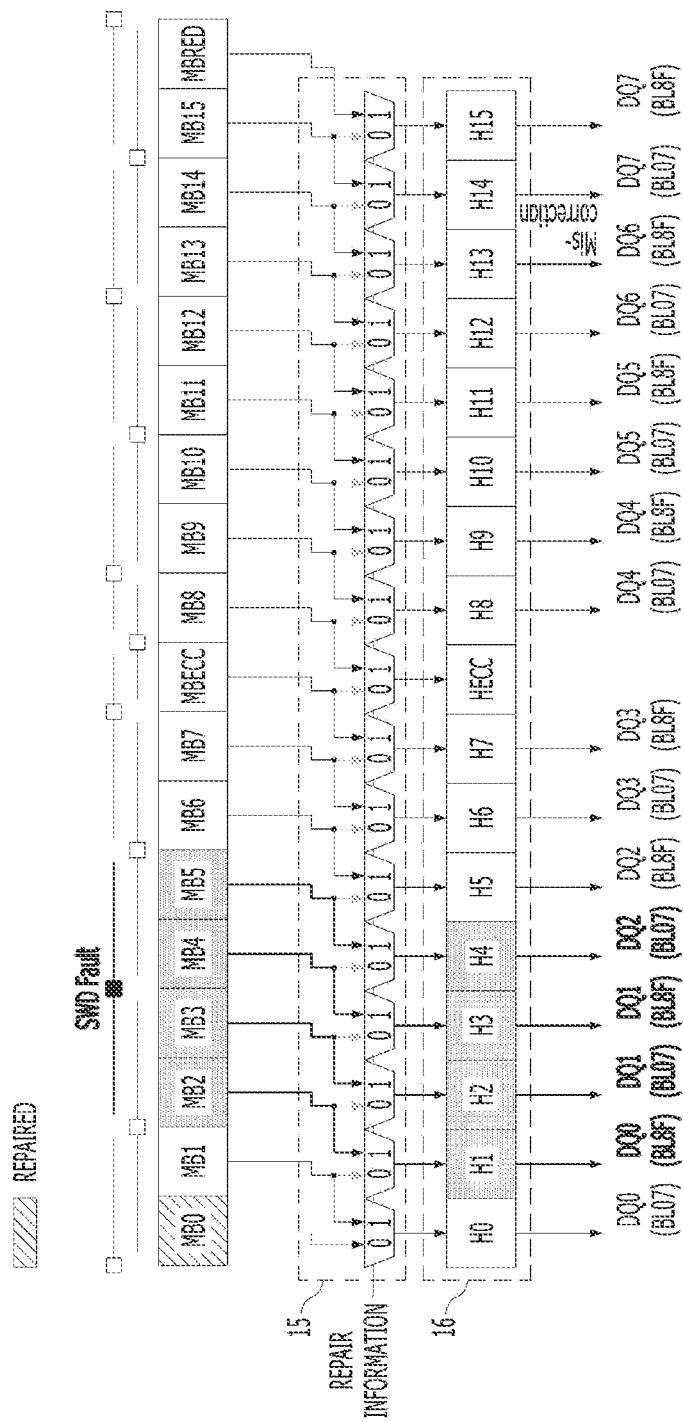

FIGS. 2A and 2B are diagrams for describing a miscorrection of an error correction device due to a defect in a sub-word line driver. FIGS. 2A and 2B illustrate a case where two cell blocks respectively output data BL07 and BL8F in 8-bit units through one pad, during a read operation.

Referring to FIG. 2A, a case where errors occurred due to a defective sub-word line driver "SWD Fault", but a column repair operation is not performed, is illustrated. The defective sub-word line driver "SWD Fault" is disposed between the fourth normal cell block MB3 and the fifth normal cell block MB4, and thus the errors may occur in the third to sixth normal cell blocks MB2 to MB5.

A repair circuit 15 does not perform a shifting operation according to repair information indicating that the column repair operation is not performed, and thus, switches of the repair circuit 15 may transfer data output from the normal cell blocks MB0 to MB15 and the ECC cell block MBECC to an on-chip error correction device 16. When the on-chip error correction device 16 is capable of 1-bit error correction, the on-chip error correction device 16 may not correct the errors due to the defective sub-word line driver "SWD Fault", resulting in miscorrection. The on-chip error correction device 16 outputs 128-bit data to an external controller through data pads DQ0 to DQ7.

In this case, the errors due to the defective sub-word line driver "SWD Fault" may exist in data output through the second data pad DQ1 and the third data pad DQ2. When the controller's error correction ability set in the specification may cover errors of continuous 32-bit data, the errors in the data may be corrected by error correction of the controller. As a result, the miscorrection may occur due to the occurrence of an error exceeding the error correction capability of the on-chip error correction device 16, but the error correction capability of the controller may cover the miscorrection. In other words, when a shifting operation for column repair is not performed, the miscorrection of the on-chip error correction device 16 due to the errors occurring in the defective sub-word line driver "SWD Fault" may occur within a specified specification (i.e., the error correction capability of the controller) to ensure a normal operation of the system.

Referring to FIG. 2B, a case where errors occurred due to a defective sub-word line driver "SWD Fault" and, at the same time, a column repair operation is performed on the first normal cell block MB0, is illustrated.

The repair circuit 15 performs a shifting operation according to repair information indicating that the column repair operation is performed. Since the column repair operation has occurred in the first normal cell block MB0, switches of the repair circuit 15 may shift and transfer data output from the remaining normal cell blocks MB1 to MBEC15, the ECC cell block MBECC, and the redundancy cell block MBRED to code calculation circuits H0 to H15 and HECC of the on-chip error correction device 16. In this case, since possible error data due to the defective sub-word line driver "SWD Fault" may be shifted and transferred to the code calculation circuits H1 to H4 from the third to sixth normal cell blocks MB2 to MB5, the on-chip error correction device 16 may cause not only the miscorrection due to the defective sub-word line driver "SWD Fault" but also an additional miscorrection. For example, the on-chip error correction device 16 may incorrectly miscorrect the data to be transferred to the seventh data pad DQ6. The on-chip error correction device 16 may output 128-bit data to the external controller through the data pads DQ0 to DQ7.

In this case, the errors due to the defective sub-word line driver "SWD Fault" may exist in data output through the first data pad DQ0, the second data pad DQ1 and the third data pad DQ2. Further, the error may also exist in the data output through the seventh data pad DQ6 due to the miscorrection of the on-chip error correction device 16. The errors of data output through the seventh data pad DQ6 may be beyond the error correction capability of the controller and therefore may not be corrected by the controller to cause failure of read operation. As a result, the errors due to the miscorrection of the on-chip error correction device 16 becomes more serious due to the shifting operation, and these errors cannot be corrected by the controller. That is, due to the shifting operation and the defective sub-word line driver, the miscorrection of an error correction device may cause errors, an amount of which exceeds a predetermined range (i.e., the error correction capability of the controller).

Therefore, for a memory device with a redundancy cell block MBRED, there is a need for a scheme for managing a miscorrection that causes additional errors due to the defective sub-word line driver, within a set specification range (or boundary) when a shifting operation for column repair is performed in the memory device with the redundancy cell block MBRED.

Figure 3:
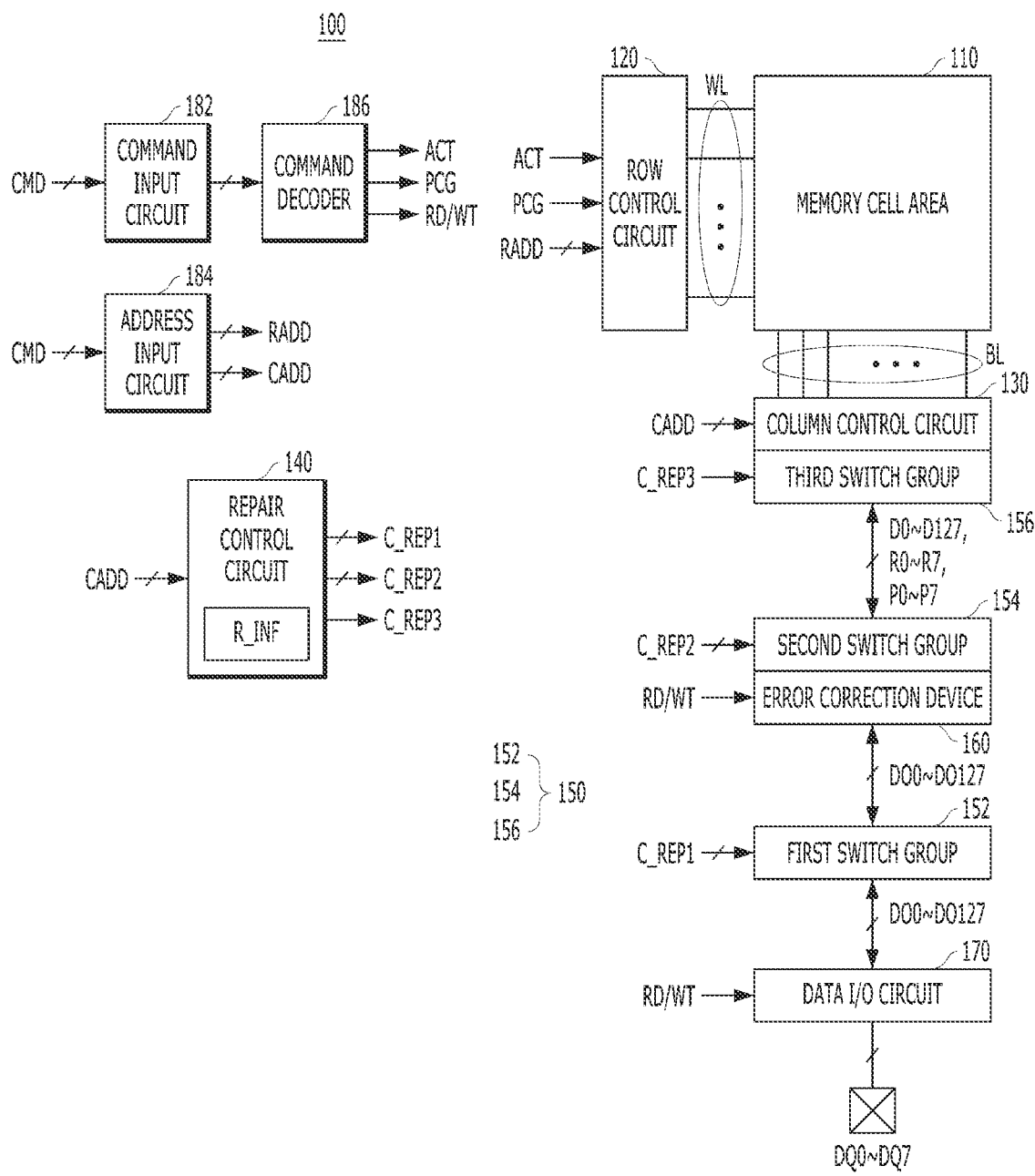
FIG. 3 is a block diagram illustrating a memory device in accordance with an embodiment of the present invention.
Figure 4:
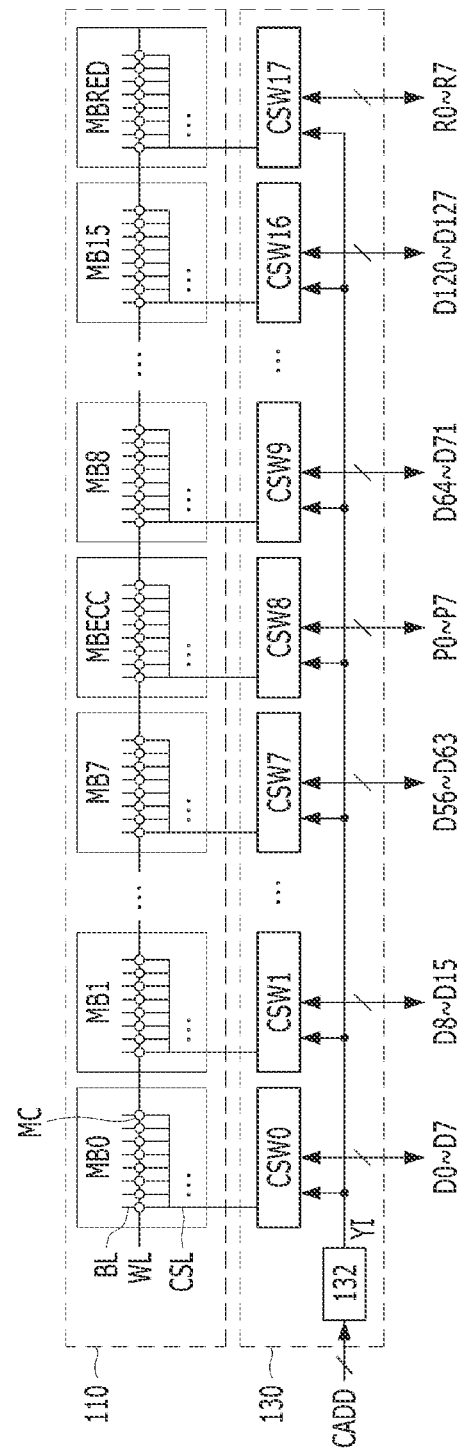
FIG. 4 is a detailed configuration diagram illustrating a memory cell area and a column control circuit of FIG. 3 according to an embodiment of the present invention.

FIG. 3 is a block diagram illustrating a memory device 100 in accordance with an embodiment of the present invention. FIG. 4 is a detailed configuration diagram illustrating a memory cell area 110 and a column control circuit 130 of FIG. 3 according to an embodiment of the present invention.

Referring to FIG. 3, the memory device 100 may include a memory cell area 110, a row control circuit 120, a column control circuit 130, a repair control circuit 140, a repair circuit 150, an error correction device 160, a data input/output (I/O) circuit 170, a command input circuit 182, an address input circuit 184, and a command decoder 186.

The command input circuit 182 may receive a command CMD, and the address input circuit 184 may receive an address ADD, from an external device e.g., a memory controller. The address input circuit 184 may receive the address ADD and output a row address RADD and a column address CADD. Each of the command CMD and the address ADD may include a multi-bit signal. The command decoder 186 may decode the command CMD input through the command input circuit 182 and may generate an active command ACT, a precharge command PCG, a read command RD, a write command WT, and the like. The command decoder 186 may generate a refresh command, and a mode register command, as well as other commands, by decoding received commands CMD.

The memory cell area 110 may be coupled to the row control circuit 120 through a plurality of word lines WL, and may be coupled to the column control circuit 130 through a plurality of bit lines BL. Referring to FIG. 4, the memory cell area 110 may include a plurality of cell blocks MB0 to MB15, MBECC, and MBRED. Each of the plurality of cell blocks MB0 to MB15, MBECC, and MBRED may include a plurality of memory cells MC arranged in an array form between the plurality of word lines WL and the plurality of bit lines BL. In an embodiment of the present invention, a "cell block" may be defined as a set of memory cells that share word lines WL and bit lines BL and are arranged in the same shape.

The plurality of cell blocks may include first to 16-th normal cell blocks MB0 to MB15, at least one error correction code (ECC) cell block MBECC, and at least one redundancy cell block MBRED. The first to 16-th normal cell blocks MB0 to MB15 may store data D0 to D127 received from an external device through the data I/O circuit 170. The first to 16-th normal cell blocks MB0 to MB15 may be regions for storing user data and are memory blocks for determining a memory capacity of the memory device 100. The ECC cell block MBECC may store error correction codes P0 to P7 generated by the error correction device 160 for an error correction operation. As will be described later, when a shifting operation for column repair is performed, the error correction codes P0 to P7 may be stored in a normal cell block (e.g., the ninth normal cell block MB8) adjacent to the ECC cell block MBECC. The error correction codes P0 to P7 may include known parity bits. The redundancy cell block MBRED may be provided for a repair operation of the first to 16-th normal cell blocks MB0 to MB15 and the ECC cell block MBECC, and may include a plurality of redundancy cells (e.g., a plurality of redundancy bit lines) to replace defective cells (e.g., a plurality of defective bit lines) among the first to 16-th normal cell blocks MB0 to MB15 and the ECC cell block MBECC.

In FIG. 4, one ECC cell block MBECC and one redundancy cell block MBRED are illustrated, but the present invention is not limited thereto, and one or more ECC cell blocks MBECC and redundancy cell blocks MBRED may be disposed. A plurality of normal cell blocks MB0 to MB15 may be divided into first to eighth normal cell blocks MB0 to MB7 corresponding to a lower group and ninth and 16-th normal cell blocks MB8 to MB15 corresponding to an upper group. In this case, the first to eighth normal cell blocks MB0 to MB7, the ECC cell block MBECC, the ninth and 16-th normal cell blocks MB8 to MB15, and the redundancy cell block MBRED may be sequentially disposed in a row direction.

Referring back to FIG. 3, the row control circuit 120 may activate the word line WL corresponding to the row address RADD according to the active command ACT and may precharge the activated word line WL according to the precharge command PCG.

The column control circuit 130 may select some bit lines from among the bit lines BL according to the column address CADD. For reference, a predetermined number of bit lines BL may be coupled to one column selection line (CSL of FIG. 4), and the column control circuit 130 may select at least one column selection line CSL from a plurality of column selection lines according to the column address CADD. As the bit lines are selected by the column control circuit 130, the data D0 to D127 and the error correction codes P0 to P15 may be read from the memory cell area 110 or written to the memory cell area 110.

Referring to FIG. 4, the column control circuit 130 may include a column decoder 132 and first to 18-th column switches CSW0 to CSW17. The column decoder 132 may decode the column address CADD to generate a column selection signal YI. The first to 18-th column switches CSW0 to CSW17 may correspond to the first to eighth normal cell blocks MB0 to MB7, the ECC cell block MBECC, the ninth to 16-th normal cell blocks MB8 to MB15, and the redundancy cell block MBRED, respectively. Each of the first to 18-th column switches CSW0 to CSW17 may select one of the column selection lines CSL of the corresponding cell block according to the column selection signal YI. As one of the column selection lines CSL is selected, a predetermined number (e.g., 8) of bit lines may be selected. According to an embodiment, the column control circuit 130 may further include a sense amplifier circuit that senses and amplifies data of the selected column selection line according to the read command RD, and a write driver that writes data to the memory cell area 110 through the selected column selection line according to the write command WT.

Referring back to FIG. 3, the repair control circuit 140 may store, as repair information R_INF, addresses of defective cells of the normal cell blocks MB0 to MB15 and the ECC cell block MBECC. The repair control circuit 140 may provide first to third repair control information C_REP1 to C_REP3 corresponding to the column address CADD to the first to third switch groups 152 to 156, respectively, based on the stored repair information R_INF. Each of the first and second repair control information C_REP1 and C_REP2 may include multi-bit signals. A detailed configuration of the repair control circuit 140 will be described with reference to FIGS. 5 to 6B.

The repair circuit 150 may include the first to third switch groups 152 to 156 with a configuration for performing a shifting operation for column repair, a zero-padding operation and a swap operation.

The first switch group 152 may transfer data DO0 to DO127 between the data I/O circuit 170 and the error correction device 160 while performing a shifting operation for column repair according to the first repair control information C_REP1. The first switch group 152 may correspond to the repair circuit 15 described in FIGS. 2A and 2B. The repair circuit 15 of FIGS. 2A and 2B is disposed between the memory cell area 110 and the error correction device 160, while the first switch group 152 of FIG. 3 is disposed between the data I/O circuit 170 (i.e., data pads DQ0 to DQ7) and the error correction device 160. For reference, since the shifting operation for column repair is performed after the error correction operation is performed during a read operation, 8-bit data R0 to R7 may be output from the redundancy cell block MBRED in addition to the 128-bit data D0 to D127 and the 8-bit error correction codes P0 to P7.

The second switch group 154 may be disposed in an input path of the error correction device 160 to perform a zero-padding operation according to the second repair control information C_REP2. The second switch group 154 may be disposed between the third switch group 156 and the error correction device 160 for a read operation, or between the first switch group 152 and the error correction device 160 for a write operation. For example, during the read operation, the second switch group 154 may transfer the data D0 to D127 and R0 to R7 from the third switch group 156 to the error correction device 160, by replacing some of the data D0 to D127 and R0 to R7 with zero-data, according to the second repair control information C_REP2. During the write operation, the second switch group 154 may transfer the data DO0 to DO127 from the first switch group 152 to the error correction device 160 by adding the data DO0 to DO127 with zero-data, according to the second repair control information C_REP2. As a result, the data of 136-bit zero-padded by the second switch group 154 may be transferred to the error correction device 160.

During a read operation, the third switch group 156 may transfer the data D0 to D127 and R0 to R7 and the error correction codes P0 to P7 between the memory cell area 110 and the second switch group 154, while performing a swap operation on data input to or output from the ECC cell block MBECC with data input to or output from the ninth normal cell block MB8 adjacent to the ECC cell block MBECC, according to the third repair control information C_REP3. For example, during the read operation, the third switch group 156 may swap the data output from the ECC cell block MBECC and the data output from the ninth normal cell block MB8 according to the third repair control information C_REP3, and transfer the swapped data to the second switch group 154. During the write operation, the third switch group 156 may swap and transfer the data input to the ECC cell block MBECC with the data input to the ninth normal cell block MB8 according to the third repair control information C_REP3. For reference, the error correction codes P0 to P7 generated from the error correction device 160 by the swap operation may be stored in one of the ECC cell block MBECC and the ninth normal cell block MB8.

The error correction device 160 may generate the error correction codes P0 to P7 using the data DO0 to DO127 from the data I/O circuit 170 and zero-padded by the second switch group 154, in response to the write command WT. The error correction device 160 may correct errors of the zero-padded data D0 to D127 and R0 to R7 transferred through the second switch group 154 from the memory cell area 110, using the error correction codes P0 to P7, in response to the read command RD. That is, during the read operation, the error correction device 160 may output the error corrected data DO0 to DO127 by correcting the errors of the data D0 to D127 and R0 to R7 zero-padded by the second switch group 154, using the error correction codes P0 to P7. The error corrected data DO0 to DO127 may be output to the outside through the data pads DQ0 to DQ7 by the data I/O circuit 170. A detailed configuration of the error correction device 160 will be described with reference to FIG. 7.

The data I/O circuit 170 may input/output the data DO0 to DO127 through the data pads DQ0 to DQ7. A unit of 16-bit data may be input through one data pad during the write operation, and a unit of 16-bit data may be output through one data pad during the read operation. When eight data pads DQ0 to DQ7 are disposed in the memory device 100, the 128-bit data DO0 to DO127 may be input to the memory device 100 during the write operation, and the 128-bit data DO0 to DO127 may be output from the memory device 100 during the read operation.

Figure 5:
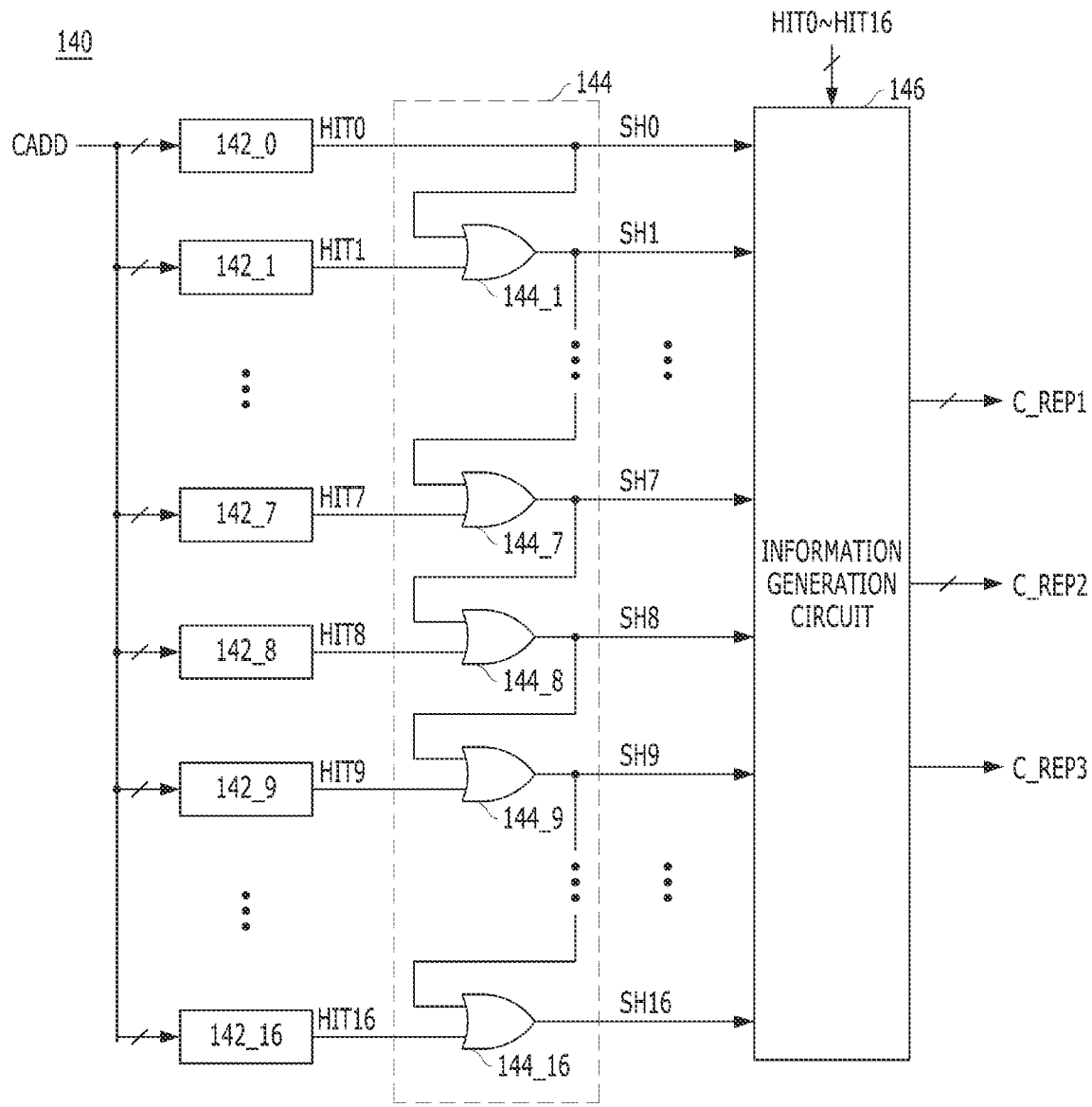
FIG. 5 is a detailed block diagram illustrating a repair control circuit of FIG. 3 according to an embodiment of the present invention.
Figure 6A:
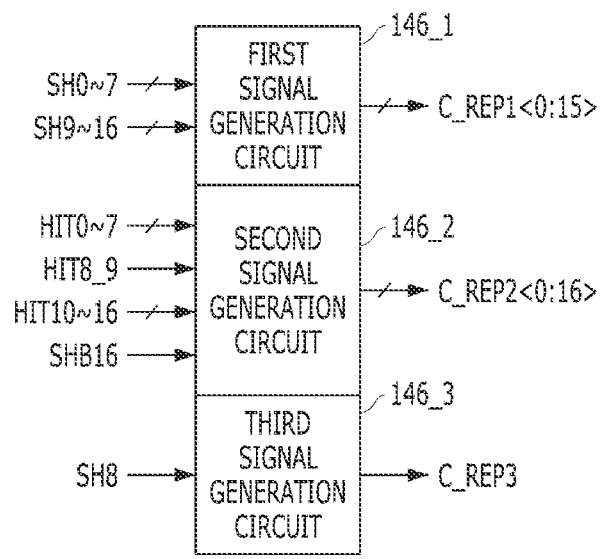

FIG. 5 is a detailed block diagram illustrating the repair control circuit 140 of FIG. 3 according to an embodiment of the present invention. FIGS. 6A and 6B are a block diagram and a table illustrating an information generation circuit 146 of FIG. 5 according to an embodiment of the present invention.

Referring to FIG. 5, the repair control circuit 140 may include first to 17-th address storing circuits 142_0 to 142_16, a shifting control circuit 144, and an information generation circuit 146.

The first to 17-th address storing circuits may correspond to the first to eighth normal cell blocks MB0 to MB7, the ECC cell block MBECC, and the ninth and 16-th normal cell blocks MB8 to MB15, respectively, and may store one or more defective addresses of the respective blocks. The first to 17-th address storage circuits 142_0 to 142_16 may generate first to 17-th match signals HIT0 to HIT16 by respectively comparing the column address CADD with the stored defective addresses. Each of the first to 17-th address storage circuits 142_0 to 142_16 may activate a corresponding match signal to a logic high level when the column address CADD is identical to any of the stored defect addresses. For reference, that a specific match signal is activated may mean that a repair operation has been performed on the corresponding cell block. For example, when the second match signal HIT1 is activated, it may mean that the second normal cell block MB1 is repaired to use the redundancy cell block MBRED, and when the ninth match signal HIT8 is activated, it may mean that the ECC cell block is repaired MBECC to use the redundant cell block MBRED.

The shifting control circuit 144 may generate first to 17-th shifting signals SH0 to SH16 respectively corresponding to the first to 17-th match signals HIT0 to HIT16. The shifting control circuit 144 may activate the first to 17-th shifting signals SH0 to SH16 to a logic high level when the first match signal HIT0 is activated, and in this way, activate the K-th to 17-th shifting signals SH(K−1) to SH16 to a logic high level when the K-th match signal HIT(K−1) is activated.

In detail, the shifting control circuit 144 may include first to 16-th OR gates 144_1 to 144_16. The shifting control circuit 144 may output the first match signal HIT0 as the first shifting signal SH0, and the first OR gate 144_1 may output the second shifting signal SH1 by performing a logic OR operation on the first shifting signal SH0 and the second match signal HIT1. In this way, the seventh OR gate 144_7 may output eighth shifting signal SH7 by performing a logic OR operation on the eighth match signal HIT7 and the seventh shifting signal SH6. That is, each of the first to 16-th OR gates 144_1 to 144_16 may perform a logic OR operation on a corresponding match signal and a shifting signal of a previous stage to output a corresponding shifting signal.

The information generation circuit 146 may generate the first to third repair control information C_REP1 to C_REP3 according to the first to 17-th match signals HIT0 to HIT16 and the first to 17-th shifting signals SH0 to SH16.

Referring to FIG. 6A, the information generation circuit 146 may include a first logic gate LG1, a second logic gate LG2, and first to third signal generation circuits 146_1 to 146_3.

The first logic gate LG1 may output an intermediate match signal HIT8_9 by performing a logic OR operation on the ninth match signal HIT8 and the tenth match signal HIT9. For reference, the ninth match signal HIT8 is a signal activated when the repair operation is performed in the ECC cell block MBECC, and the tenth match signal HIT9 is a signal activated when the repair operation is performed in the ninth normal cell blocks MB8. That is, the intermediate match signal HIT8_9 may be activated when the repair operation is performed in the ECC cell block MBECC or the ninth normal cell blocks MB8. The second logic gate LG2 may invert the 17-th shifting signal SH16 to output an inverted shifting signal SHB16. Since the 17-th shifting signal SH16 is a signal indicating that any one repair operation is performed and the redundancy cell block MBRED is used, the inverted shifting signal SHB16 may be activated when no repair occurs. Hereinafter, the inverted shifting signal SHB16 is defined as a no-repair signal SHB16.

The first signal generation circuit 146_1 may configure the 16-bit first repair information C_REP1 using the first to eighth shifting signals SH0 to SH7 and the tenth to 17-th shifting signals SH9 to SH16. For example, as shown in FIG. 6B, in a case where the first match signal HIT0 is activated due to the repair operation in the first normal cell block MB0, and thus all of the first to 17-th shifting signals SH0 to SH16 are activated, the first signal generation circuit 146_1 may generate the first repair information C_REP1 of all high bits. In a case where the second match signal HIT1 is activated due to the repair operation in the second normal cell block MB1, and thus all of the second to 17-th shifting signals SH1 to SH16 are activated, the first signal generation circuit 146_1 may generate the first repair information C_REP1 in which bits except for a least significant bit (LSB) are all high bits. In a case where the ninth match signal HIT8 is activated due to the repair operation in the ECC cell block MBECC and thus all of the ninth to 17-th shifting signals SH8 to SH16 are activated, or the tenth match signal HIT9 is activated due to the repair operation in the ninth normal cell block MB8 and thus all of the tenth to 17-th shifting signals SH9 to SH16 are activated, the first signal generation circuit 146_1 may generate the first repair information C_REP1 in which only the upper 8 bits are all high bits. In a case where the 17-th match signal HIT16 is activated due to the repair operation in the 16-th cell block MB15 and thus the 17-th shifting signal SH16 is only activated, the first signal generation circuit 146_1 may generate the first repair information C_REP1 in which only a most significant bit (MSB) is a high bit. In a case where all match signals HIT0 to HIT16 are deactivated due to no repair and thus the first to 17-th shifting signals SH0 to SH16 are deactivated, the first signal generation circuit 146_1 may generate the first repair information C_REP1 of all low bits.

The second signal generation circuit 146_2 may configure the 17-bit second repair information C_REP2 using the first to eighth match signals HIT0 to HIT7, the intermediate match signal HIT8_9, the eleventh to 17-th match signals HIT10 to HIT16, and the no-repair signal SHB16. For example, as shown in FIG. 6B, in a case where the first match signal HIT0 is activated due to the repair operation in the first normal cell block MB0, the second signal generation circuit 146_2 may generate the second repair information C_REP2 in which only a first bit is a high bit. In a case where the second match signal HIT1 is activated due to the repair operation in the second normal cell block MB1, the second signal generation circuit 146_2 may generate the second repair information C_REP2 in which only a second bit is a high bit. In a case where the ninth match signal HIT8 is activated due to the repair operation in the ECC cell block MBECC or the tenth match signal HIT9 is activated due to the repair operation in the ninth normal cell block MB8, the second signal generation circuit 146_2 may generate the second repair information C_REP2 in which only a ninth bit is a high bit. In a case where the 17-th match signal HIT16 is activated due to the repair operation in the 16-th cell block MB15, the second signal generation circuit 146_2 may generate the second repair information C_REP2 in which only a 16-th bit is a high bit. In a case where all match signals HIT0 to HIT16 are deactivated due to no repair, the second signal generation circuit 146_2 may generate the second repair information C_REP2 in which only a 17-th bit is a high bit.

The third signal generation circuit 146_3 may output the ninth shifting signal SH8 as the third repair information C_REP3. For example, as shown in FIG. 6B, the third signal generation circuit 146_3 may generate the third repair information C_REP3 of a high bit when the repair operation is performed in one of the first to eighth normal cell blocks MB0 to MB7 and the ECC cell block MBCC and thus the ninth shifting signal SH8 is activated. The third signal generation circuit 146_3 may generate the third repair information C_REP3 of a low bit when the repair operation is not performed, or the repair operation is performed in one of the ninth to 16-th normal cell blocks MB8 to MB15 and thus the ninth shifting signal SH8 is deactivated.

Figure 7:
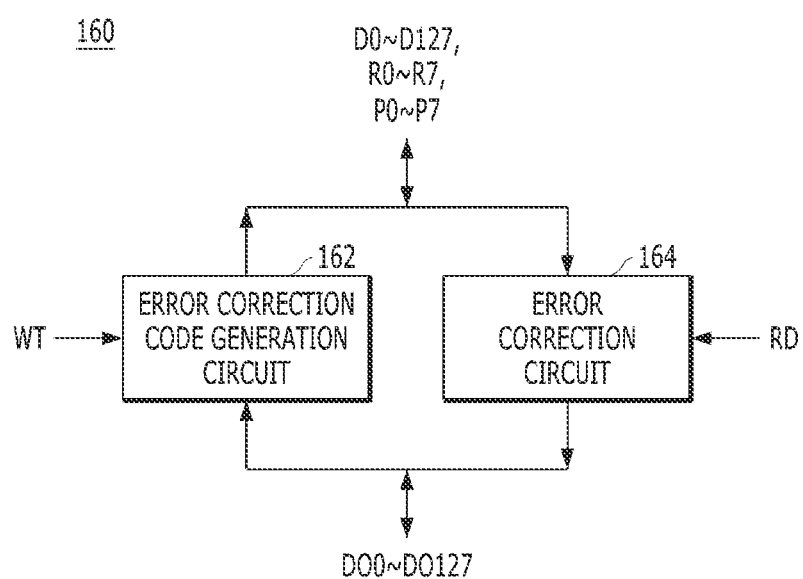
FIG. 7 is a block diagram illustrating an error correction deice of FIG. 3.

FIG. 7 is a block diagram illustrating the error correction deice 160 of FIG. 3 according to an embodiment of the present invention.

Referring to FIG. 7, the error correction device 160 may include an error correction code generation circuit 162 and an error correction circuit 164.

The error correction code generation circuit 162 may generate the error correction codes P0 to P7 of 8-bit, using the zero-padded data DO0 to DO127, during the write operation in which the write command WT is input. Since the error correction codes P0 to P7 are generated by the error correction code generation circuit 162 without performing an error correction operation during the write operation, the data DO0 to DO127 input to the error correction code generation circuit 162 are the same as the data DO to D127 output from the error correction code generation circuit 162.

The error correction circuit 164 may correct errors in the zero-padded data DO to D127 and R0 to R7, using the error correction codes P0 to P7 of 8-bit, during the read operation in which the read command RD is input. Here, correcting the error may mean detecting the error of the data DO to D127 and R0 to R7 using the error correction codes P0 to P7 and correcting the error when the error is detected. The data DO0 to DO127 in which the error is corrected by the error correction circuit 164 may be output to the outside through the data pads DQ0 to DQ7 by the data I/O circuit 170.

The error correction code generation circuit 162 or the error correction circuit 164 may generate the error correction codes using a check matrix, also called an H matrix, which will be described below.

Meanwhile, the error correction code generation circuit 162 and the error correction circuit 164 may generate the error correction code using a check matrix, also called an H matrix, and correct an error using the error correction codes. To this end, the error correction code generation circuit 162 and the error correction circuit 164 may include a plurality of check matrix calculation circuits (hereinafter, referred to as "code calculation circuits"). According to an embodiment, the error correction code generation circuit 162 and the error correction circuit 164 may use common code calculation circuits or may use separate code calculation circuits, respectively. The code calculation circuit may generate the error correction codes by applying a known BCH code, Hamming code, or RS code. The code calculation circuit may generate the error correction codes by applying another type of parity code.

Hereinafter, detailed configurations of a memory device according to an embodiment of the present invention and a connection relationship therebetween will be described with reference to the drawings.

Figure 8A:
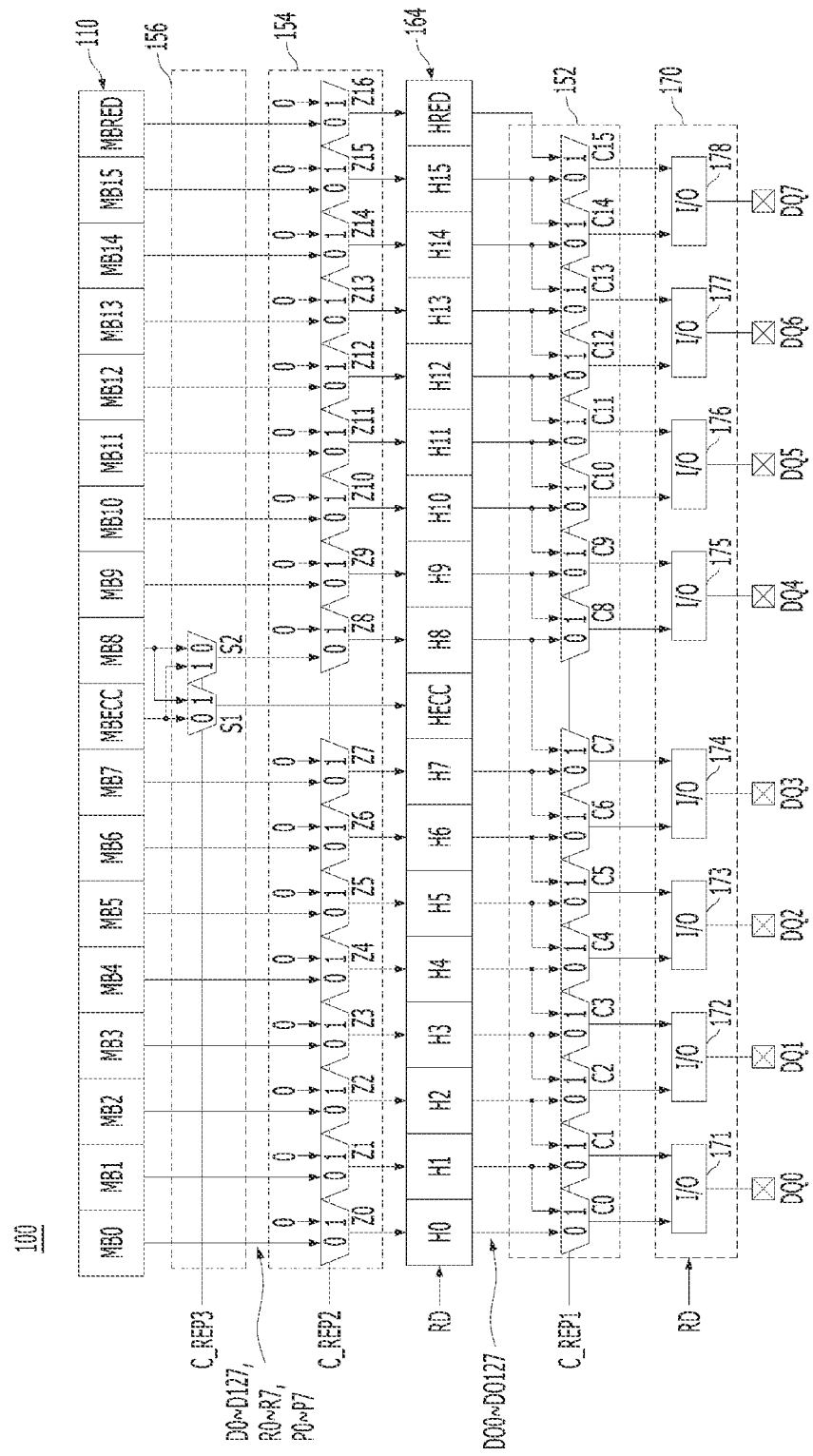
FIGS. 8A and 8B are diagrams illustrating the memory device of FIG. 3 in more detail according to an embodiment of the present invention.
Figure 8B:
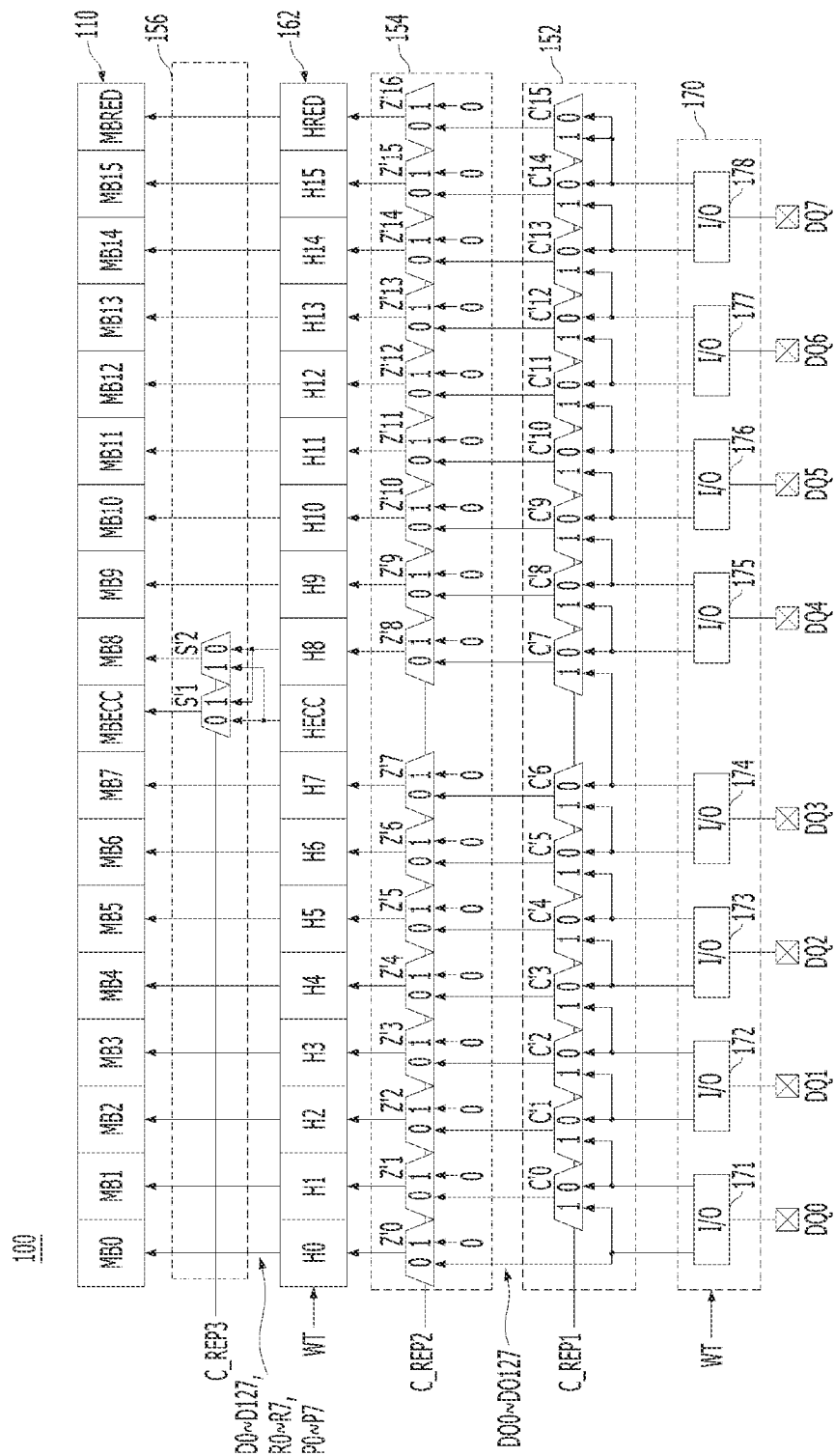

FIGS. 8A and 8B are diagrams illustrating the memory device 100 of FIG. 3 in more detail according to an embodiment of the present invention.

Referring to FIG. 8A, configurations for a read operation of the memory device 100 are illustrated. The error correction circuit 164 of the error correction device 160 may include a plurality of normal code calculation circuits H0 to H15, at least one ECC code calculation circuit HECC, and at least one redundancy code calculation circuit HRED. The plurality of code calculation circuits may respectively correspond to the plurality of cell blocks. The on-chip error correction device 16 of FIGS. 2A and 2B includes the code calculation circuits H0 to H15 and HECC having the number (i.e., 17) corresponding to the normal cell blocks MB0 to MB15 and the ECC cell block MBECC, whereas the error correction circuit 164 according to the embodiment of the present invention may include the code calculation circuits H0 to H15, HECC, and HRED having the number (i.e., 18) corresponding to the normal cell blocks MB0 to MB15, the ECC cell block MBECC, and the redundancy cell block MBRED.

During the read operation, the third switch group 156 may transfer the data D0 to D127 and R0 to R7 and the error correction codes P0 to P7 output from the memory cell area 110 to the second switch group 154, while performing a swap operation on the data output from the ECC cell block MBECC with the data output from the ninth normal cell block MB8, according to the third repair control information C_REP3.

In detail the third switch group 156 may include a first swap switch S1 and a second swap switch S2. The first swap switch S1 may transfer one of the data output from the ECC cell block MBECC and the data output from the ninth normal cell block MB8 to the ECC code calculation circuit HECC, according to the third repair information C_REP3. The second swap switch S2 may transfer the other one of the data output from the ECC cell block MBECC and the data output from the ninth normal cell block MB8 to the second switch group 154, according to the third repair information C_REP3.

For example, when the third repair information C_REP3 is set to a low bit, the first swap switch S1 may transfer the data output from the ECC cell block MBECC to the ECC code calculation circuit HECC, and the second swap switch S2 may transfer the data output from the ninth normal cell block MB8 to the second switch group 154. Accordingly, when the third repair information C_REP3 is a low bit, the third switch group 156 may transfer, without swapping, the data output from the ECC cell block MBECC and the data output from the ninth normal cell block MB8 respectively to the ECC code calculation circuit HECC and the second switch group 154. On the other hand, when the third repair information C_REP3 is set to a high bit, the first swap switch S1 may transfer the data output from the ninth normal cell block MB8 to the ECC code calculation circuit HECC, and the second swap switch S2 may transfer the data output from the ECC cell block MBECC to the second switch group 154. Accordingly, when the third repair information C_REP3 is a high bit, the third switch group 156 may swap the data output from the ECC cell block MBECC with the data output from the ninth normal cell block MB8 and transfer the swapped data respectively to the ECC code calculation circuit HECC and the second switch group 154.

The second switch group 154 may perform a zero-padding operation according to the second repair control information C_REP2. During the read operation, the second switch group 154 may select the data DO to D127 and R0 to R7 transferred through the third switch group 156, or zero-data, according to the second repair control information C_REP2, and transfer the selected data to the error correction circuit 164.

In detail, the second switch group 154 may include a plurality of second switches (hereinafter, referred to as "first to 17-th zero-padding switches Z0 to Z16") respectively corresponding to the normal code calculation circuits H0 to H15 and the redundancy code calculation circuit HRED. The first to 17-th zero-padding switches Z0 to Z16 may receive the respective bits of the second repair control information C_REP2 in the order of a lowest bit LSB to a highest bit MSB. Each of the first to 17-th zero-padding switches Z0 to Z16 may select data output from the corresponding cell block, or zero-data "0", according to a corresponding bit of the 17-bit second repair information C_REP2, and transfer the selected data to a corresponding code calculation circuit. For example, the first to 17-th zero-padding switches Z0 to Z16 may perform a zero-padding operation by inputting the zero-data "0" to the corresponding code calculation circuit instead of the data output from the corresponding cell block when the corresponding bit is a high bit. For reference, in FIG. 8A, the first to 17-th zero-padding switches Z0 to Z16 are each shown as one multiplexer, but each switch may include a number of multiplexers corresponding to the number of bits (i.e., 8-bit) of data.

The code calculation circuits H0 to H15, HECC, and HRED of the error correction circuit 164 may calculate a syndrome using a check matrix, and correct an error based on the syndrome and the error correction codes. In this case, the error correction circuit 164 may correct an error of 136-bit data on which the zero-padding operation has been performed using the 8-bit error correction codes P0 to P7. The code calculation circuits H0 to H15, HECC, and HRED may transfer the error-corrected data DO0 to DO127 to the first switch group 152.

The first switch group 152 may selectively perform a shifting operation for column repair according to the first repair control information C_REP1. During the read operation, the first switch group 152 may transfer the data DO0 to DO127 from the code calculation circuits H0 to H15 and HRED to the data I/O circuit 170 by shifting the data DO0 to DO127 according to the first repair control information C_REP1.

In detail, the first switch group 152 may include a plurality of first switches (hereinafter, referred to as "first to 16-th repair switches C0 to C15") respectively corresponding to the normal code calculation circuits H0 to H15. The first to 16-th repair switches C0 to C15 may receive the respective bits of the first repair control information C_REP1 in the order of a lowest bit LSB to a highest bit MSB. Each of the first to 16-th repair switches C0 to C15 may select data output from a corresponding normal code calculation circuit or data output from an adjacent code calculation circuit according to a corresponding bit of the 16-bit first repair information C_REP1, and transfer the selected data to the data I/O circuit 170. For example, each of the first to 16-th repair switches C0 to C15 may perform a shifting operation for column repair by transferring the data output from the corresponding normal code calculation circuit when the corresponding bit is a low bit, and by transferring the data output from the adjacent code calculation circuit when the corresponding bit is a high bit. For reference, in FIG. 8A, the first to 16-th repair switches C0 to C15 are each illustrated as one multiplexer, but each switch may include multiplexers corresponding to the number of bits (i.e., 8-bit) of data.

The data I/O circuit 170 may include first to eighth input/output parts 171 to 178 for inputting/outputting the 128-bit data DO0 to DO127 through the data pads DQ0 to DQ7. The first to eighth input/output parts 171 to 178 each correspond to two adjacent switches among the first to 16-th repair switches C0 to C15, and 8-bit data output from two adjacent switches may be alternately output to a data pad during the read operation.

Referring to FIG. 8B, configurations for a write operation of the memory device 100 are illustrated. The error correction code generation circuit 162 of the error correction device 160 may include a plurality of normal code calculation circuits H0 to H15, at least one ECC code calculation circuit HECC, and at least one redundancy code calculation circuit HRED. The plurality of code calculation circuits may respectively correspond to the plurality of cell blocks.

During the write operation, the first to eighth input/output parts 171 to 178 of the data I/O circuit 170 may respectively receive 8-bit data input through the data pads DQ0 to DQ7, and alternately transfer the data to the first switch group 152.

The first switch group 152 may selectively perform a shifting operation for column repair according to the first repair control information C_REP1. During the write operation, the first switch group 152 may transfer the data DO0 to DO127 to the second switch group 154 by shifting the data transferred from the first to eighth input/output parts 171 to 178 according to the first repair control information C_REP1.

In detail, the first switch group 152 may include first to 16-th repair switches C'0 to C'15. The first repair switch C'0 may correspond to the first input/output part 171 and may selectively receive 8-bit data among 16-bit data input through the first input/output part 171 according to the LSB of the first repair information C_REP1. Two adjacent switches among the second to 15-th repair switches C'1 to C'14 may correspond to the second to eighth input/output parts 172 to 178, respectively, and may alternately receive 8-bit data among 16-bit data input through the second to eighth input/output parts 172 to 178. Each of the second to 15-th repair switches C'1 to C'14 may select data transferred from a corresponding input/output part or an adjacent input/output part according to a corresponding bit of the first repair information C_REP1 and transfer the selected data to the second switch group 154. The 16-th repair switch C'15 may receive 8-bit data among 16-bit data input through the eighth input/output part 178 according to the MSB of the first repair information C_REP1. Since both input terminals of the 16-th repair switch C'15 receive the same data, the 16-th repair switch C'15 may transfer the 8-bit data to the second switch group 154 regardless of a logic level of the MSB of the first repair information C_REP1.

The second switch group 154 may perform a zero-padding operation according to the second repair control information C_REP2. During the write operation, the second switch group 154 may select the data DO0 to DO127 transferred from the first switch group 152, or zero-data, according to the second repair control information C_REP2 and transfer the selected data to the error correction code generation circuit 162.

In detail, the second switch group 154 may include first to 17-th zero-padding switches Z'0 to Z'16 respectively corresponding to the normal code calculation circuits H0 to H15 and the redundancy code calculation circuit HRED. Each of the first to 17-th zero-padding switches Z'0 to Z'16 may select the data DO0 to DO127 transferred from the first switch group 152, or zero-data "0", according to a corresponding bit of the 17-bit second repair information C_REP2 and transfer the selected data to a corresponding code calculation circuit. For example, when the corresponding bit is a high bit, the first to 17-th zero-padding switches Z'0 to Z'16 may perform a zero-padding operation by inputting the zero-data "0" to the corresponding code calculation circuit, respectively. For reference, the first zero-padding switch Z'0 may directly receive the data transferred from the first input/output part 171, and the second to 17-th zero-padding switches Z'0 to Z'16 may respectively receive data transferred from the first to 16-th repair switches C'0 to C'15. According to an embodiment, the 16-th repair switch C'15 may be omitted, and 8-bit data input through the eighth input/output part 178 may be directly provided to the 17-th zero-padding switch Z'16.

The code calculation circuits H0 to H15, HECC, and HRED of the error correction code generation circuit 162 may generate the error correction codes P0 to P7 of 8-bit, based on the zero-padded data DO0 to DO127 and R0 to R7, using a check matrix, during the write operation.

During the write operation, the third switch group 156 may transfer the zero-padded data DO to D127 and R0 to R7 and the error correction codes P0 to P7 output from the code calculation circuits H0 to H15, HECC, and HRED to the memory cell area 110, while performing a swap operation on the data input to the ECC cell block MBECC with the data input to the ninth normal cell block MB8, according to the third repair control information C_REP3.

In detail the third switch group 156 may include a first swap switch S'1 and a second swap switch S'2. The first swap switch S'1 may transfer one of the data output from the ECC code calculation circuit HECC and the data output from the ninth normal code calculation circuit H8, to the ECC cell block MBECC, according to the third repair information C_REP3. The second swap switch S'2 may transfer the other one of the data output from the ECC code calculation circuit HECC and the data output from the ninth normal code calculation circuit H8 to the ninth normal cell block MB8, according to the third repair information C_REP3.

For example, when the third repair information C_REP3 is set to a low bit, the first swap switch S'1 may transfer the data output from the ECC code calculation circuit HECC to the data output from the ECC cell block MBECC, and the second swap switch S'2 may transfer the data output from the ninth normal code calculation circuit H8 to the ninth normal cell block MB8. On the other hand, when the third repair information C_REP3 is set to a high bit, the first swap switch S'1 may transfer the data output from the ninth normal code calculation circuit H8 to the ECC cell block MBECC, and the second swap switch S'2 may transfer the data output from the ECC code calculation circuit HECC to the ninth normal cell block MB8.

Hereinafter, an operation of a memory device of the present invention according to various embodiments will be described with reference to the drawings. For convenience of description, a write operation under a specific condition will be described first, and then a read operation accordingly will be described.

Figure 9A:
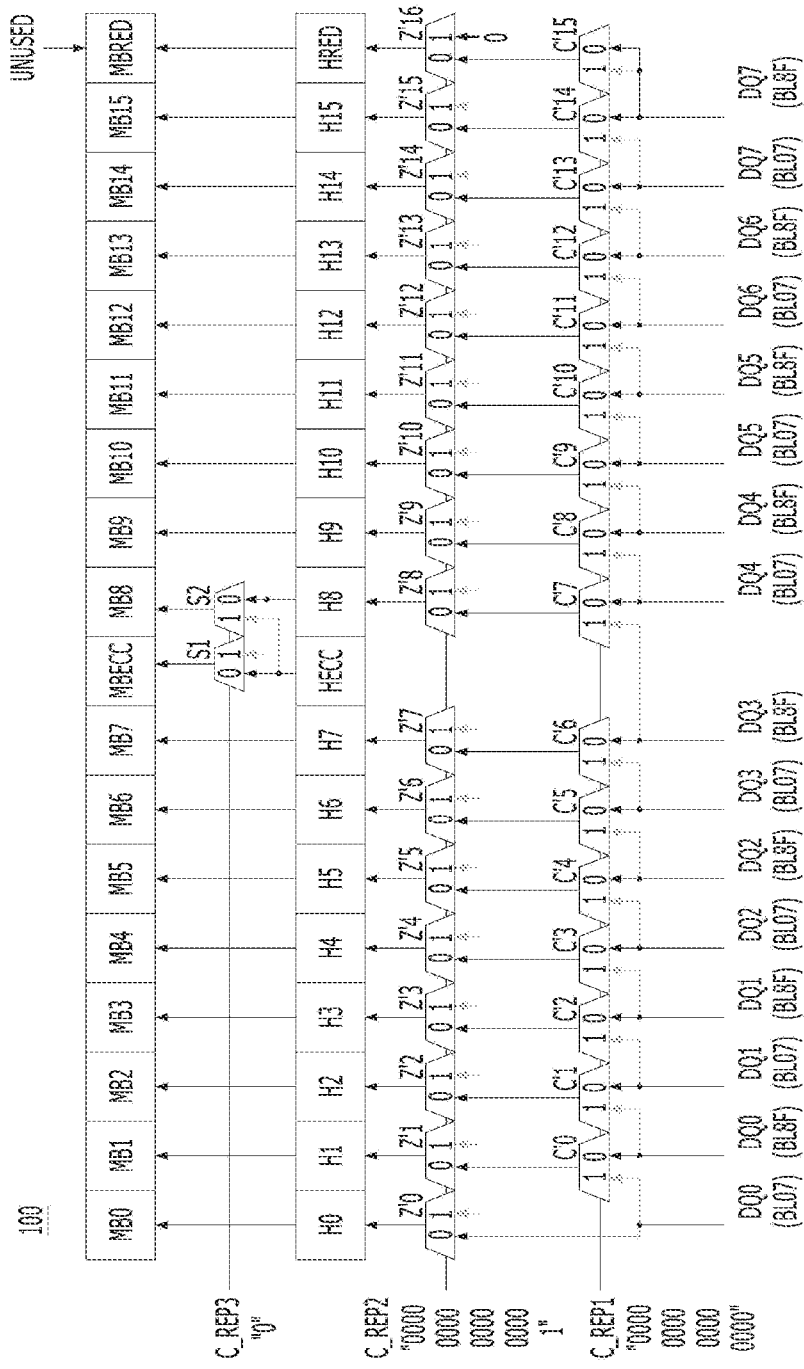
FIGS. 9A to 12B are diagrams illustrating an operation of a memory device according to various embodiments of the present invention.
Figure 9B:
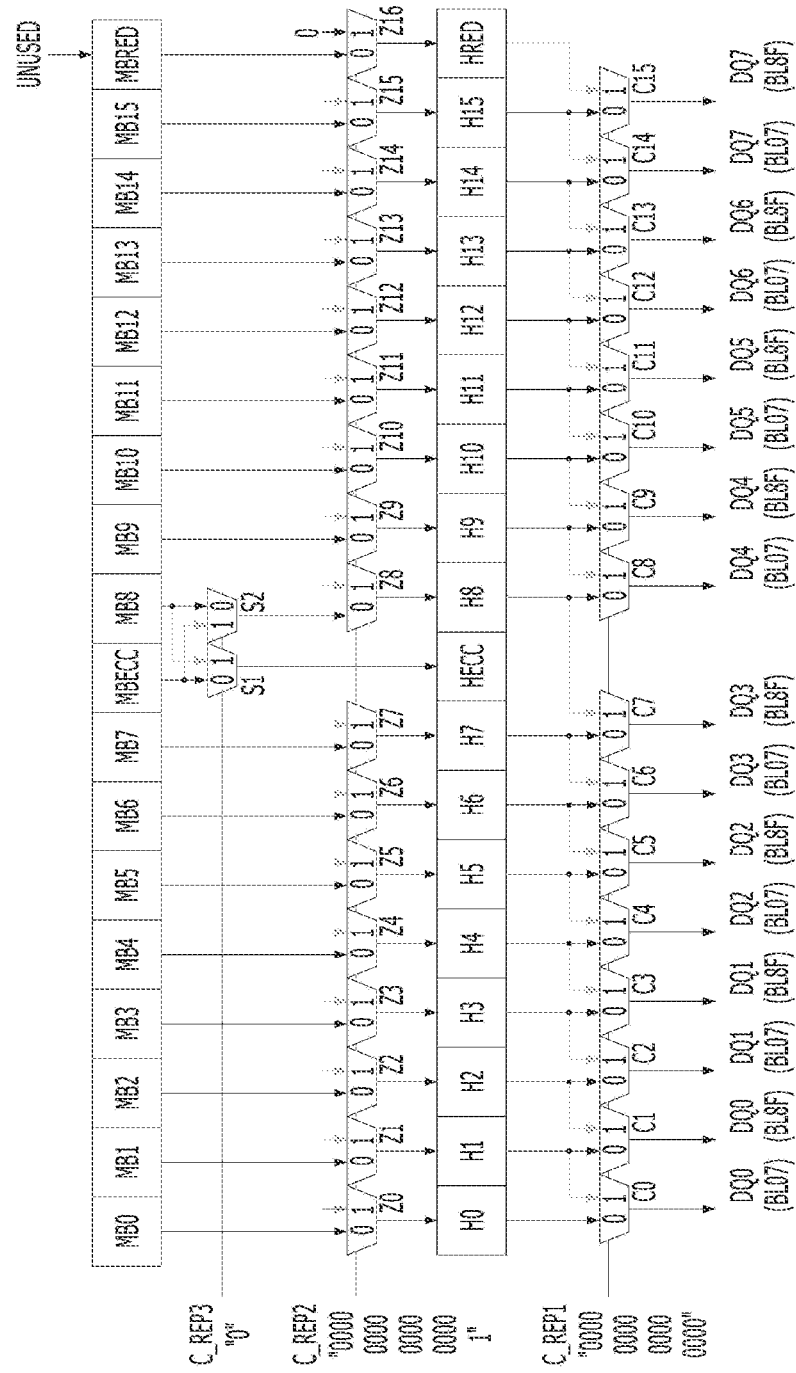

FIGS. 9A and 9B illustrate a write operation and a read operation when there is no defect in a sub-word line driver and a column repair operation is not performed. As described in FIG. 6B, the information generation circuit 146 may generate the first repair information C_REP1 of all low bits, the second repair information C_REP2 in which only MSB is a high bit, and the third repair information C_REP3 of a low bit.

Referring to FIG. 9A, the first to eighth input/output parts 171 to 178 may receive 8-bit data among 16-bit data BL07 and BL8F input through a corresponding data pad, respectively, and alternately transfer the received data to the first switch group 152.

The first to 16-th repair switches C'0 to C'15 of the first switch group 152 may transfer the data from the first to eighth input/output parts 171 to 178 to the second switch group 154 without performing a shifting operation, according to the first repair information C_REP1 of all low bits. The second switch group 154 may perform a zero-padding operation according to the second repair control information C_REP2. According to the second repair information C_REP2 in which only MSB is a high bit, only the 17-th zero-padding switch Z'16 among the first to 17-th zero-padding switches Z'0 to Z'16 may select the zero-data "0" and transfer the selected data, i.e., the zero-data R0 to R7 to the redundancy code calculation circuit HRED.

The code calculation circuits H0 to H15, HECC, and HRED of the error correction code generation circuit 162 may generate the 8-bit error correction codes P0 to P7 based on the data DO0 to DO127 and R0 to R7 on which the zero-padding operation has been performed. The third switch group 156 may transfer the data DO to D127 and R0 to R7 and the error correction codes P0 to P7, output from the code calculation circuits H0 to H15, HECC, and HRED to the memory cell area 110 according to the third repair control information C_REP3. According to the third repair information C_REP3 of a low bit, the first swap switch S'1 may transfer the data output from the ECC code calculation circuit HECC to the ECC cell block MBECC, and the second swap switch S'2 may transfer the data output from the ninth normal code calculation circuit H8 to the ninth normal cell MB8. Accordingly, the 128-bit data input through the data pads DQ0 to DQ7 and the error correction codes P0 to P7 generated based on the 128-bit data are respectively written to the first to 16-th normal cell blocks MB0 to MB15 and the ECC cell block MBECC. In this case, the redundancy cell block MBRED is not used "UNUSED".

Referring to FIG. 9B, the third switch group 156 may transfer the data DO to D127 and R0 to R7, and the error correction codes P0 to P7 output from the memory cell area 110 to the second switch group 154 according to the third repair control information C_REP3. According to the third repair information C_REP3 of a low bit, the first swap switch S1 may transfer the data output from the ECC cell block MBECC to the ECC code calculation circuit HECC, and the second swap switch S2 may transfer the data output from the ninth normal cell block MB8 to the second switch group 154. The second switch group 154 may perform a zero-padding operation according to the second repair control information C_REP2. According to the second repair information C_REP2 in which only MSB is a high bit, the 17-th zero-padding switch Z17 may select the zero-data "0" instead of the data output from the redundancy cell block MBRED, and transfer the selected data to the redundancy code calculation circuit HRED.

The code calculation circuits H0 to H15, HECC, and HRED may correct errors of the 136-bit data on which the zero-padding operation has been performed using the 8-bit error correction code P0 to P7. The code calculation circuits H0 to H15, HECC, and HRED may transfer the error-corrected data DO0 to DO127 to the first switch group 152. According to the first repair information C_REP1 of all low bits, the first to 16-th repair switches C0 to C15 may transfer the data output from the respective normal code calculation circuits H0 to H15 without performing a shifting operation. Accordingly, the error-corrected data DO0 to DO127 are read from the first to 16-th normal cell blocks MB0 to MB15 and the ECC cell block MBECC through the data pads DQ0 to DQ7.

Figure 9C:
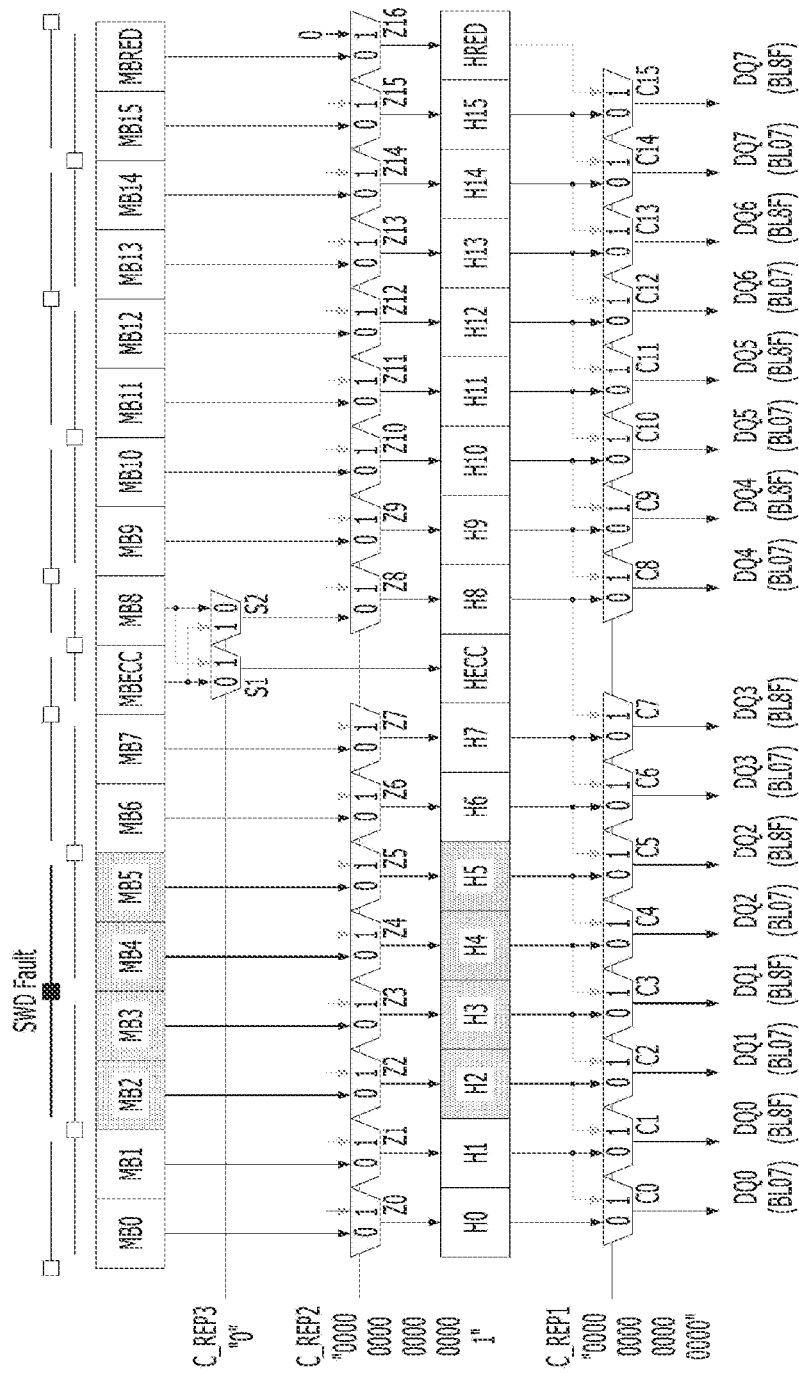

Referring to FIG. 9C, during the read operation described in FIG. 9B, a defect occurs in the sub-word line driver between the fourth normal cell block MB3 and the fifth normal cell block MB4. Due to the defect in the sub-word line driver between the fourth normal cell block MB3 and the fifth normal cell block MB4, errors may occur in the third to sixth normal cell blocks MB2 to MB5.

The error correction circuit 164 fails to correct the errors due to the defect in the sub-word line driver, and the first to 16-th repair switches C0 to C15 of the first switch group 152 may output the 128-bit data through the data pads DQ0 to DQ7 without performing a shifting operation. In this case, the errors due to the defect may exist in the data output through the second data pad DQ1 and the third data pad DQ2. When the controller's error correction ability set in the specification may cover errors of continuous 32-bit data, the errors in the data may be corrected by error correction of the controller. That is, when the shifting operation is not performed, a miscorrection of the error correction circuit 164 due to the errors occurring in the defective sub-word line driver "SWD Fault" may occur within a set range.

Figure 10A:
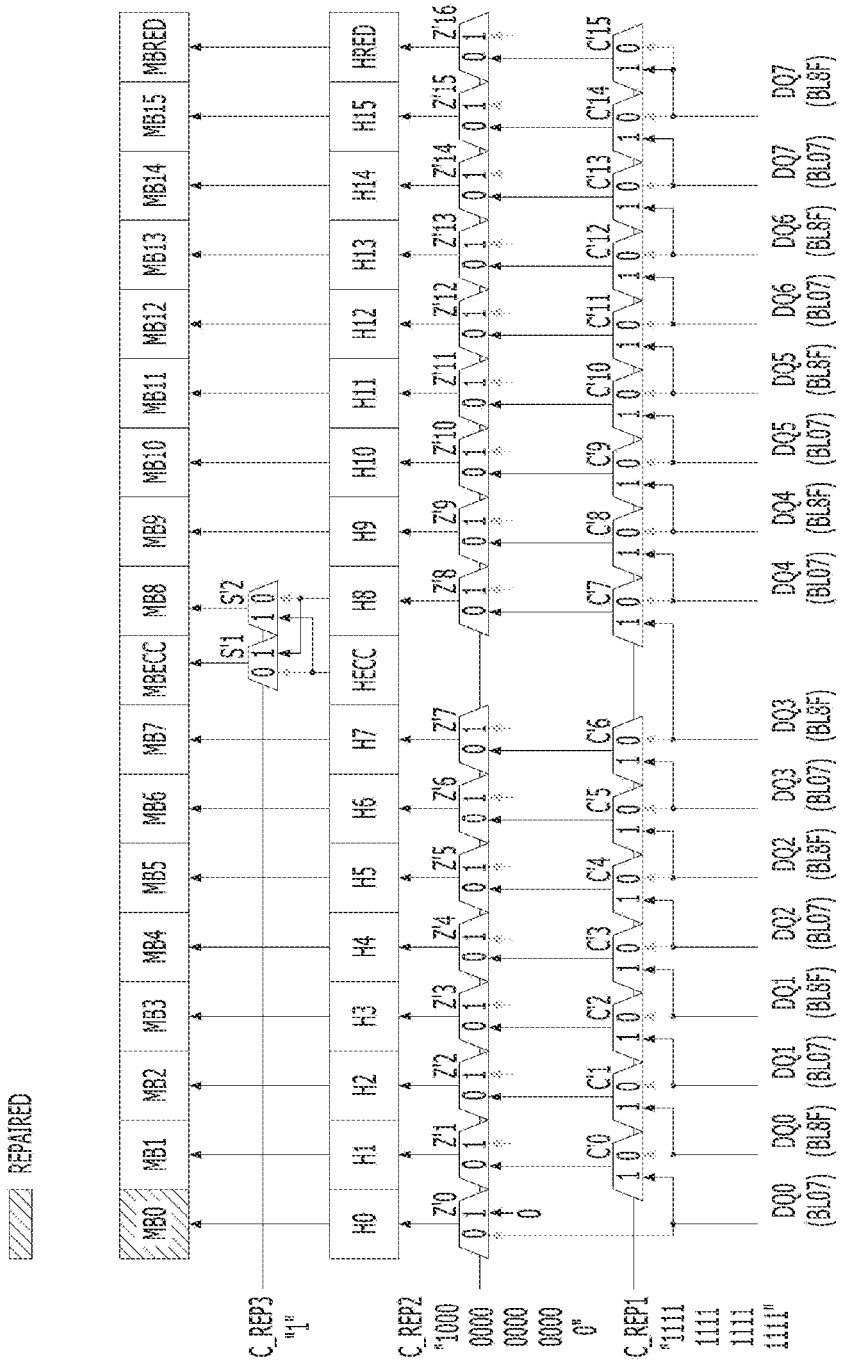
Figure 10B:
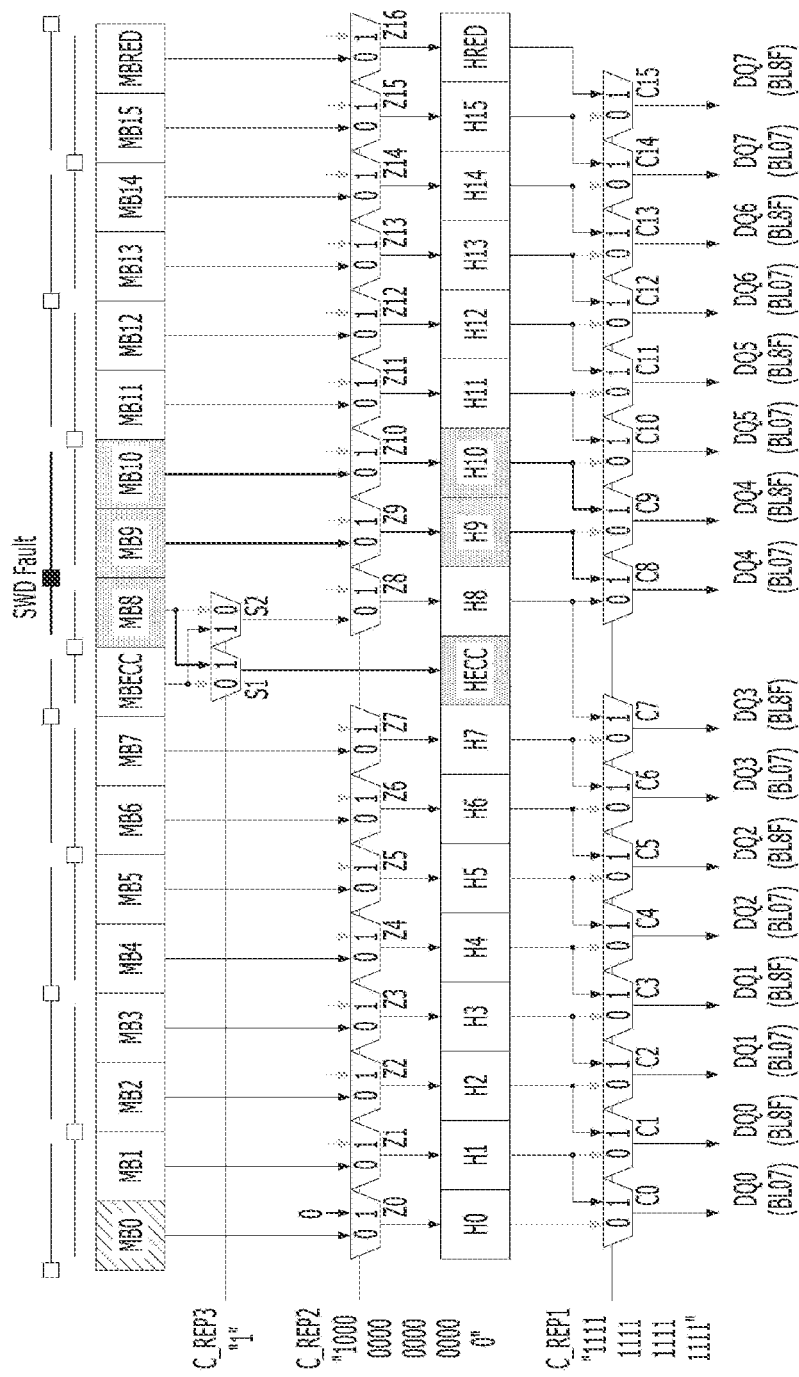

FIGS. 10A and 10B illustrate a write operation and a read operation when a defect occurs in a sub-word line driver between the ninth normal cell block MB8 and the tenth normal cell block MB9, and the first normal cell block MB0 is repaired according to an embodiment of the present invention. As described in FIG. 6B, the information generation circuit 146 may generate the first repair information C_REP1 of all high bits, the second repair information C_REP2 in which only LSB is a high bit, and the third repair information C_REP3 of a high bit.

Referring to FIG. 10A, the first to 16-th repair switches C'0 to C'15 of the first switch group 152 may transfer the data from the first to eighth input/output parts 171 to 178 to the second switch group 154 by performing a shifting operation, according to the first repair information C_REP1 of all high bits. According to the second repair information C_REP2 in which only LSB is a high bit, only the first zero-padding switch Z'0 may select the zero-data "0" and transfer the selected zero-data "0" to the first normal code calculation circuit H0.

The code calculation circuits H0 to H15, HECC, and HRED of the error correction code generation circuit 162 may generate the 8-bit error correction codes P0 to P7 based on the data DO0 to DO127 on which the zero-padding operation has been performed. According to the third repair information C_REP3 of a high bit, the first swap switch S'1 may transfer the data output from the ECC code calculation circuit HECC to the ninth normal cell MB8, and the second swap switch S'2 may transfer the data output from the ninth normal code calculation circuit H8 to the ECC cell block MBECC.

Accordingly, the 8-bit zero-data is written to the first normal cell block MB0 and the 128-bit data input through the data pads DQ0 to DQ7 and the error correction codes P0 to P7 generated based on the zero-padded 136-bit data are respectively written to the second to 16-th normal cell blocks MB1 to MB15, the ECC cell block MBECC and the redundancy cell block MBRED. In this case, the error correction codes P0 to P7 may be written to the ninth normal cell block MB8, not the ECC cell block MBECC.

Referring to FIG. 10B, according to the third repair information C_REP3 of a high bit, the third switch group 156 may swap the data output from the ECC cell block MBECC with the data output from the ninth normal cell block MB8, and transfer the swapped data to the second switch group 154. According to the second repair information C_REP2 in which only LSB is a high bit, the first zero-padding switch Z0 may select the zero-data "0" instead of the data output from the first normal cell block MB0 and transfer the selected zero-data "O" to the first normal code calculation circuit H0. The code calculation circuits H0 to H15, HECC, and HRED may correct errors of 136-bit data on which the zero-padding operation has been performed using the 8-bit error correction codes P0 to P7. The code calculation circuits H0 to H15, HECC, and HRED may transfer the error-corrected data DO0 to DO127 to the first switch group 152. According to the first repair information C_REP1 of all high bits, the first to 16-th repair switches C0 to C15 may shift and transfer the data output from the code calculation circuits. Accordingly, the first normal cell block MB0 may be repaired.

In this case, due to the defect in the sub-word line driver between the ninth normal cell block MB8 and the tenth normal cell block MB9, the errors may occur in the ninth to eleventh normal cell blocks MB8 to MB10. Since the errors due to the defect exist in the data output through the fifth data pad DQ4, the errors in the data may be corrected by error correction of the controller.

Meanwhile, depending on the specifications of a memory device or memory system, a controller may not be able to correct errors if the errors occur in both of data transferred through a lower data pad group DQ0 to DQ3 and data transferred through an upper data pad group DQ4 to DQ7. For example, in FIG. 10B, when the third switch group 156 is omitted, the errors may exist not only in the data output through the fifth data pad DQ4 but also in the data output through the fourth data pad DQ3. Therefore, in an embodiment of the invention, the third switch group 156 may swap the data of the ECC cell block MBECC with the data of the ninth normal cell block MB8 so that the errors occur only in the data transferred through one of the upper and lower data pad groups.

Figure 11A:
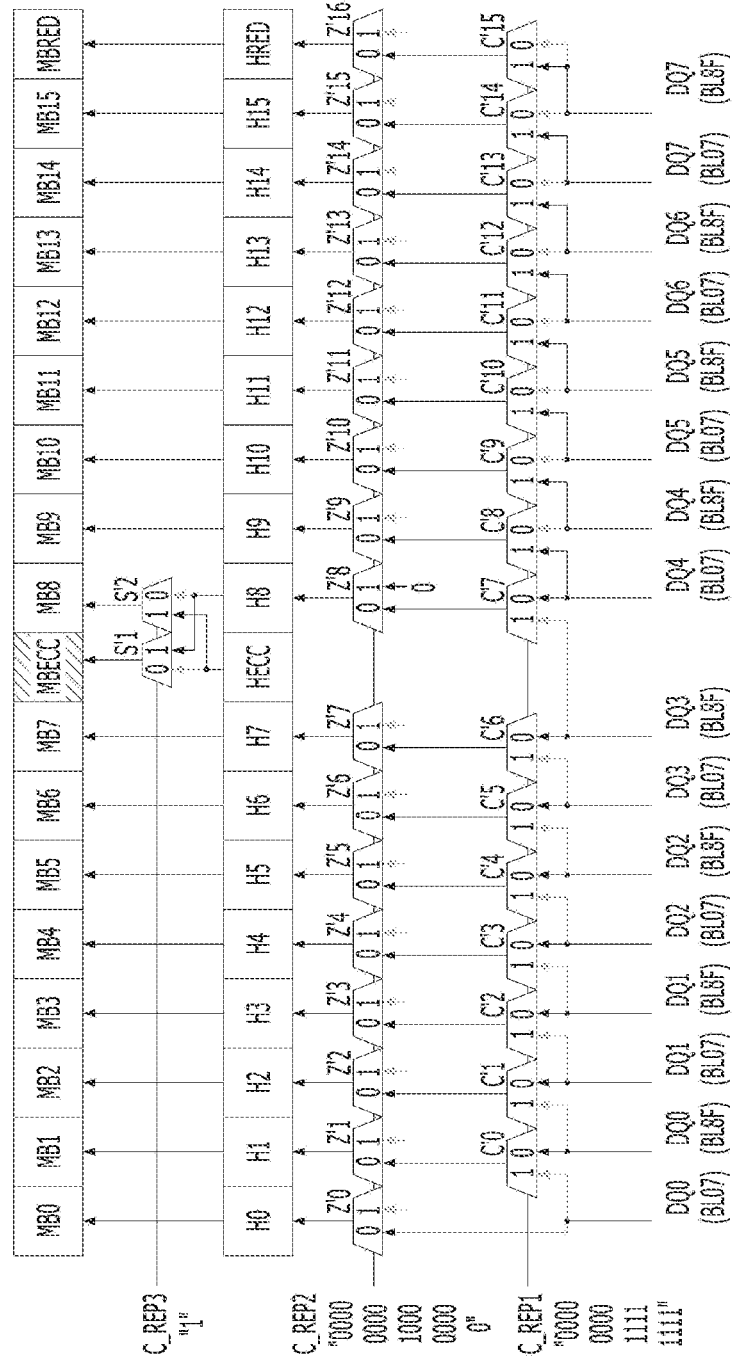
Figure 11B:
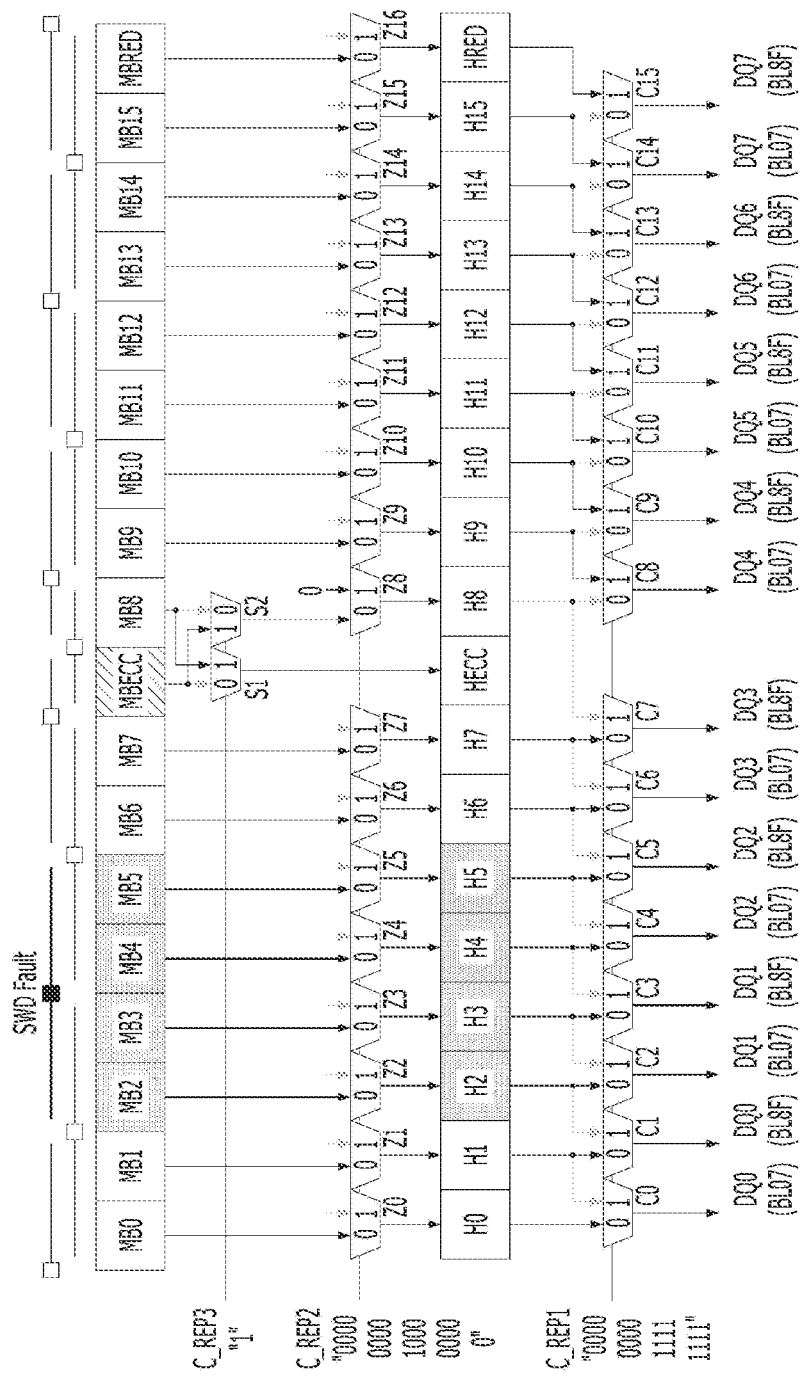

FIGS. 11A and 11B illustrate a write operation and a read operation when a defect occurs in a sub-word line driver between the fourth normal cell block MB3 and the fifth normal cell block MB4, and the ECC cell block MBECC is repaired according to an embodiment of the present invention. As described in FIG. 6B, the information generation circuit 146 may generate the first repair information C_REP1 in which only the upper 8 bits are all high bits, the second repair information C_REP2 in which only a ninth bit is a high bit, and the third repair information C_REP3 of a high bit.

Referring to FIG. 11A, the ninth to 16-th repair switches C'8 to C'15 of the first switch group 152 may transfer the data to the second switch group 154 by performing a shifting operation, according to the first repair information C_REP1 in which only the upper 8 bits are all high bits. According to the second repair information C_REP2 in which only a ninth bit is a high bit, only the ninth zero-padding switch Z'8 may select the zero-data "0" and transfer the selected zero-data "0" to the ninth normal code calculation circuit H8. The code calculation circuits H0 to H15, HECC, and HRED of the error correction code generation circuit 162 may generate the 8-bit error correction codes P0 to P7 based on the data DO0 to DO127 on which the zero-padding operation has been performed. According to the third repair information C_REP3 of a high bit, the first swap switch S'1 may transfer the data output from the ECC code calculation circuit HECC to the ninth normal cell MB8, and the second swap switch S'2 may transfer the data output from the ninth normal code calculation circuit H8 to the ECC cell block MBECC.

Accordingly, the 8-bit zero-data is written to the ECC cell block MBECC and the 128-bit data input through the data pads DQ0 to DQ7 and the error correction codes P0 to P7 generated based on the 136-bit zero-padded data are respectively written to the first to 16-th normal cell blocks MB0 to MB15, and the redundancy cell block MBRED. In this case, the error correction codes P0 to P7 may be written to the ninth normal cell block MB8, not the ECC cell block MBECC.

Referring to FIG. 11B, according to the third repair information C_REP3 of a high bit, the third switch group 156 may swap the data output from the ECC cell block MBECC with the data output from the ninth normal cell block MB8, and transfer the swapped data to the second switch group 154. According to the second repair information C_REP2 in which only a ninth bit is a high bit, the ninth zero-padding switch Z8 may select the zero-data "0" instead of the data output from the ECC cell block MBECC, and transfer the selected zero-data "0" to the ninth normal code calculation circuit H8. The code calculation circuits H0 to H15, HECC, and HRED may correct errors of 136-bit data on which the zero-padding operation has been performed using the 8-bit error correction codes P0 to P7. The code calculation circuits H0 to H15, HECC, and HRED may transfer the error-corrected data DO0 to DO127 to the first switch group 152. According to the first repair information C_REP1 in which only the upper 8 bits are all high bits, the ninth to 16-th repair switches C8 to C15 may shift and transfer the data output from the code calculation circuits.

Accordingly, the ECC cell block MBECC may be repaired. Since the errors due to the defect in the sub-word line driver may exist in the data output through the second data pad DQ1 and the third data pad DQ2, the errors in the data may be corrected by error correction of the controller.

Figure 12A:
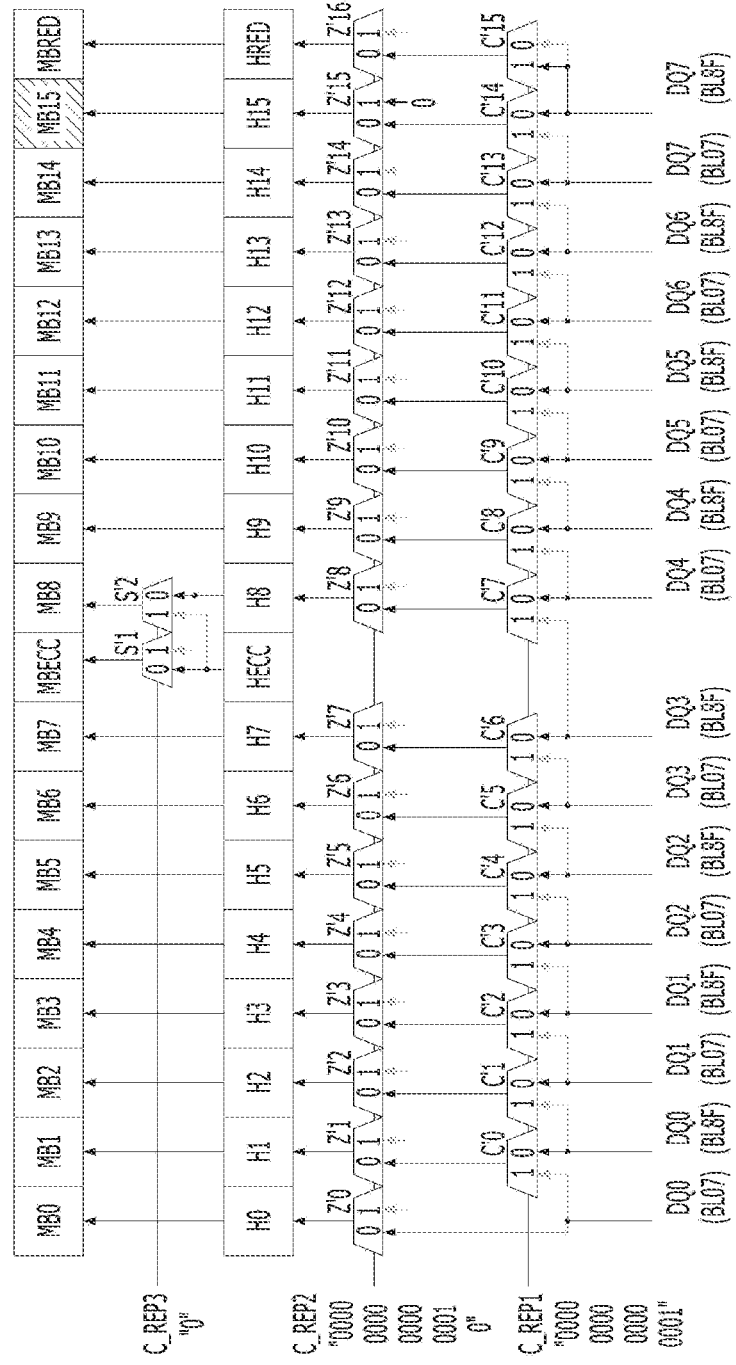
Figure 12B:
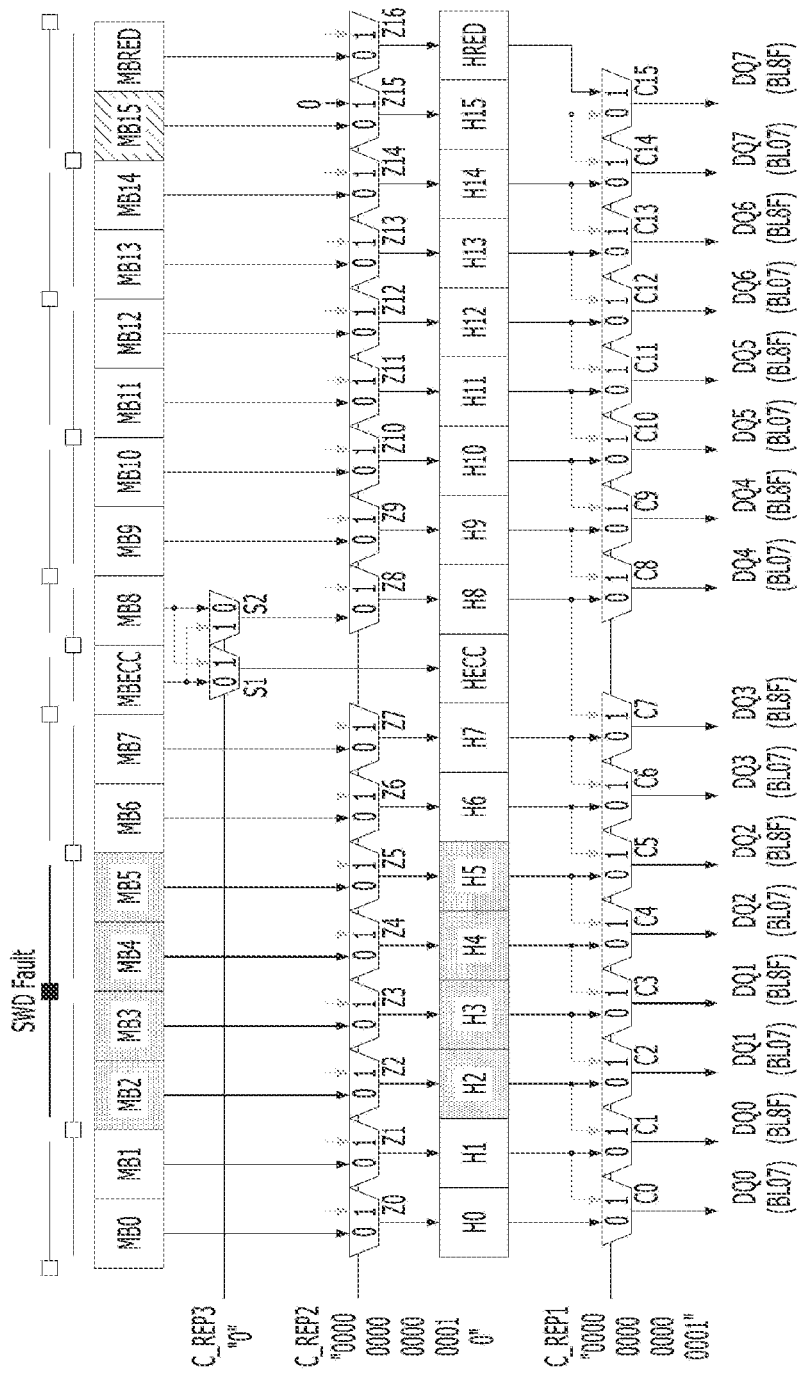

FIGS. 12A and 12B illustrate a write operation and a read operation when a defect occurs in a sub-word line driver between the fourth normal cell block MB3 and the fifth normal cell block MB4, and the 16-th cell block MB15 is repaired according to an embodiment of the present invention. As described in FIG. 6B, the information generation circuit 146 may generate the first repair information C_REP1 in which only MSB is a high bit, the second repair information C_REP2 in which only a 16-th bit is a high bit, and the third repair information C_REP3 of a low bit.

Referring to FIG. 12A, only the 16-th repair switch C'15 of the first switch group 152 may transfer the data to the second switch group 154 by performing a shifting operation, according to the first repair information C_REP1 in which only MSB is a high bit. According to the second repair information C_REP2 in which only a 16-th bit is a high bit, only the 16-th zero-padding switch Z'15 may select the zero-data "0" and transfer the selected zero-data "O" to the 16-th normal code calculation circuit H15. The code calculation circuits H0 to H15, HECC, and HRED of the error correction code generation circuit 162 may generate the 8-bit error correction codes P0 to P7 based on the data DO0 to DO127 on which the zero-padding operation has been performed. According to the third repair information C_REP3 of a low bit, the first swap switch S'1 may transfer the data output from the ECC code calculation circuit HECC to the ECC cell block MBECC, and the second swap switch S'2 may transfer the data output from the ninth normal code calculation circuit H8 to the ninth normal cell MB8.

Accordingly, the 8-bit zero-data is written to the 16-th normal cell block MB15 and the 128-bit data input through the data pads DQ0 to DQ7 and the error correction codes P0 to P7 generated based on the zero-padded 136-bit data are respectively written to the first to 15-th normal cell blocks MB0 to MB14, the ECC cell block MBECC, and the redundancy cell block MBRED.

Referring to FIG. 12B, according to the third repair information C_REP3 of a low bit, the third switch group 156 may transfer the data output from the ECC cell block MBECC and the data output from the ninth normal cell block MB8, to the second switch group 154, without performing a swapping operation. According to the second repair information C_REP2 in which only a 16-th bit is a high bit, the 16-th zero-padding switch Z15 may select the zero-data "0" instead of the data output from the 16-th normal cell block MB15 and transfer the selected zero-data "0" to the 16-th normal code calculation circuit H15. The code calculation circuits H0 to H15, HECC, and HRED may correct errors of 136-bit data on which the zero-padding operation has been performed using the 8-bit error correction codes P0 to P7. The code calculation circuits H0 to H15, HECC, and HRED may transfer the error-corrected data DO0 to DO127 to the first switch group 152. According to the first repair information C_REP1 in which only MSB is a high bit, the 16-th repair switch C15 may shift and transfer the data output from the redundancy code calculation circuit HRED.

Accordingly, the 16-th normal cell block MB15 may be repaired. Since the errors due to the defect in the sub-word line driver may exist in the data output through the second data pad DQ1 and the third data pad DQ2, the errors in the data may be corrected by error correction of the controller.

As described above, the memory device 100 according to the embodiment of the invention may place the first switch group 152 between the error correction device 160 and the data pads DQ0 to DQ7, and may place the second switch group 154 in the input path of the error correction device 160. The memory device 100 may perform a zero-padding-based error correction operation using the second switch group 154 and then perform a shifting operation for column repair using the first switch group 152. Accordingly, during the shifting operation for column repair, the miscorrection of the error correction device due to the defective sub-word line driver may be suppressed within the set specification range (or boundary), i.e., within the error correction capability of the controller. In addition, the memory device 100 may additionally place the third switch group 156 for swapping data input/output from the normal cell block MB8 adjacent to the ECC cell block MBECC and manage errors only in data transferred through either the lower data pad group DQ0 to DQ3 or the upper data pad group DQ4 to DQ7. Accordingly, the error correction capability according to the specification of the memory device or the memory system may be maximized.

Meanwhile, the memory device 100 according to the above embodiment may control the errors to exist only in the data transferred through one of the lower data pad groups DQ0 to DQ3 and the upper data pad groups DQ4 to DQ7 by using the first and second swap switches S1, S'1, S2 and S'2. In the following embodiment, a configuration of the memory device 100 will be described when the controller may correct errors even if the errors exist in the data transferred through both of the lower data pad groups DQ0 to DQ3 and the upper data pad groups DQ4 to DQ7.

Figure 13A:
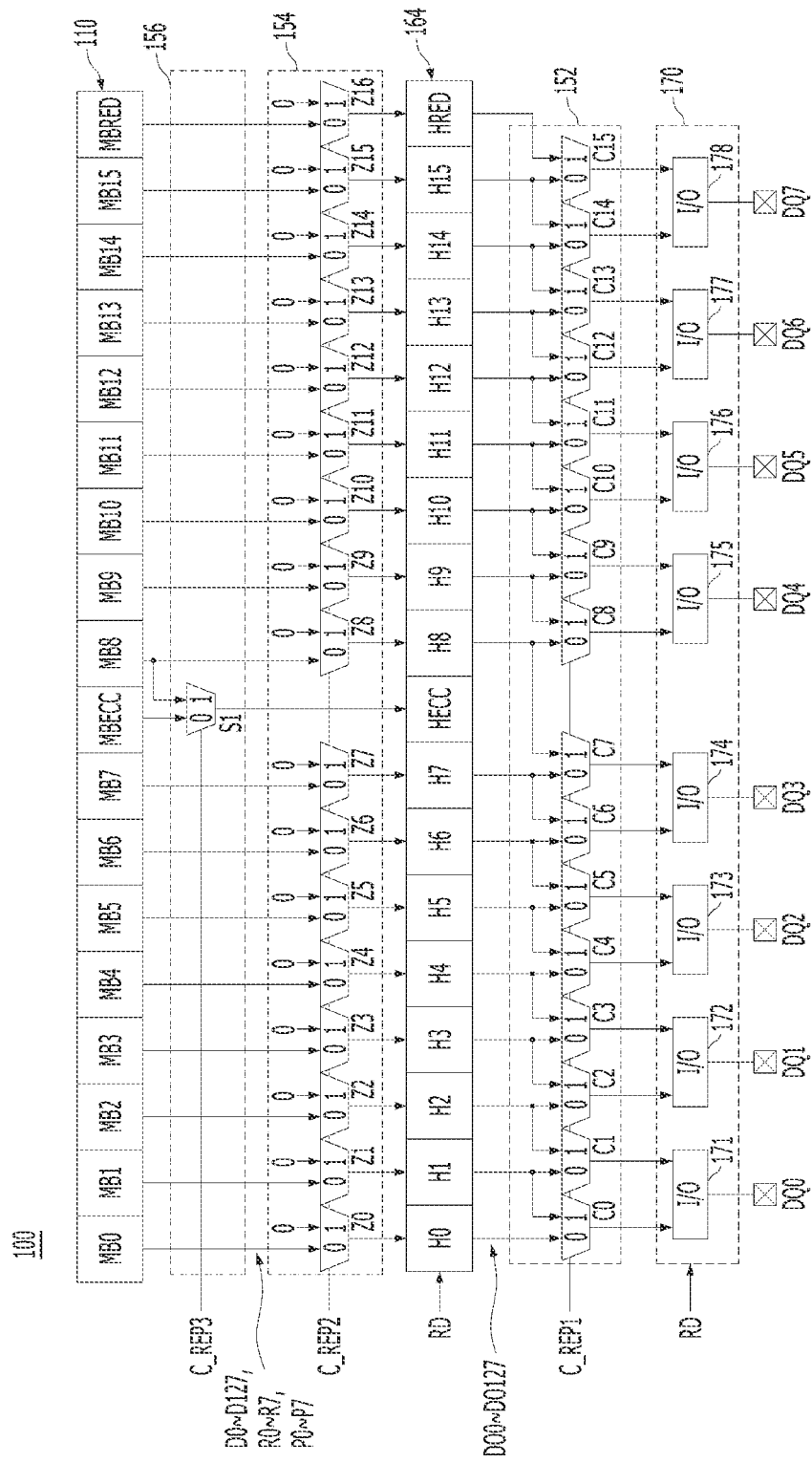
Figure 13B:
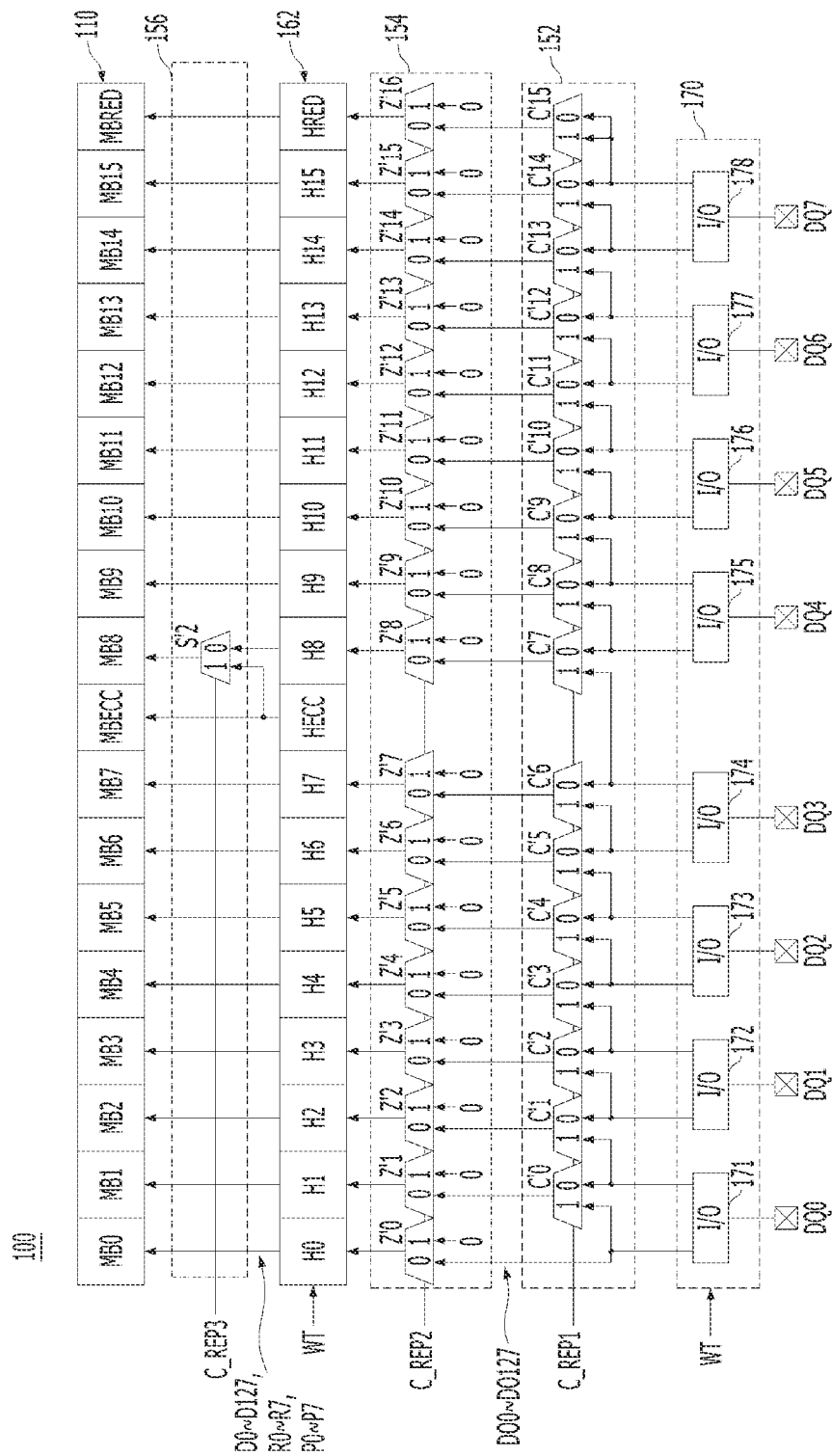

FIGS. 13A to 13C are diagrams illustrating a modified example of the memory device 100 of FIGS. 8A and 8B according to an embodiment of the present invention.

Referring to FIG. 13A, configurations for a read operation of the memory device 100 are illustrated. Except for the configuration of the third switch group 156, the configurations shown in FIG. 13A are substantially the same as those shown in FIG. 8A.

During the read operation, the third switch group 156 may transfer the data D0 to D127 and R0 to R7 and the error correction codes P0 to P7 output from the memory cell area 110 to the second switch group 154, while performing a swap operation on the data output from the ECC cell block MBECC with the data output from the ninth normal cell block MB8, according to the third repair control information C_REP3. In detail the third switch group 156 may include a first swap switch S1. The first swap switch S1 may transfer one of the data output from the ECC cell block MBECC and the data output from the ninth normal cell block MB8 to the ECC code calculation circuit HECC, according to the third repair information C_REP3. The first swap switch S1 of FIG. 13A may perform substantially the same configuration and operation as the first swap switch S1 of FIG. 8A.

Referring to FIG. 13B, configurations for a write operation of the memory device 100 are illustrated. Except for the configuration of the third switch group 156, the configurations shown in FIG. 13B are substantially the same as those shown in FIG. 8B.

During the write operation, the third switch group 156 may transfer the zero-padded data D0 to D127 and R0 to R7 and the error correction codes P0 to P7 output from the code calculation circuits H0 to H15, HECC, and HRED to the memory cell area 110, while performing a swap operation on the data output from the ECC code calculation circuit HECC with the data output from the ninth code calculation circuit H8, according to the third repair control information C_REP3. In detail the third switch group 156 may include a second swap switch S'2. The second swap switch S'2 may transfer the other one of the data output from the ECC code calculation circuit HECC and the data output from the ninth normal code calculation circuit H8 to the ninth normal cell block MB8, according to the third repair information C_REP3. The second swap switch S'2 of FIG. 13B may perform substantially the same configuration and operation as the first swap switch S'2 of FIG. 8B.

Referring to FIG. 13C, the first to third repair control information C_REP1 to C_REP3 of FIGS. 13A and 13B generated by the repair control circuit 140 is shown. Except for the third repair control information C_REP3 of FIG. 13C, the first and second repair control information C_REP1 and C_REP2 are substantially the same as those of FIG. 6B.

In the embodiment, the third signal generation circuit 146_3 of the information generation circuit 146 may output the ninth match signal HIT8 as the third repair information C_REP3. For example, as illustrated in FIG. 13C, the third signal generation circuit 146_3 may generate the third repair information C_REP3 of a high bit when the ninth match signal HIT8 is activated due to repair in the ECC cell block MBCC. The third signal generation circuit 146_3 may generate the third repair information C_REP3 of a low bit when no repair occurs or when the ninth match signal HIT8 is deactivated due to repair in one of the first to 16-th normal cell blocks MB0 to MB15.

With the above configuration, if the repair occurs in the ECC cell block MBCC, the third repair information C_REP3 of a high bit may be generated. During the write operation, the second swap switch S'2 may transfer the data output from the ECC code calculation circuit HECC to the ninth normal cell block MB8 according to the third repair information C_REP3 of a high bit. At this time, the data output from the ECC code calculation circuit HECC is also transferred to the ECC cell block MBECC, but is not used because the ECC cell block MBCC has been repaired. During the read operation, the first swap switch S1 may transfer the data output from the ninth normal cell block MB8 to the ECC code calculation circuit HECC.

Meanwhile, in the following embodiment, a method of merging the second switch group 154 performing a zero-padding operation into the error correction device 160 is proposed.

Figure 14A:
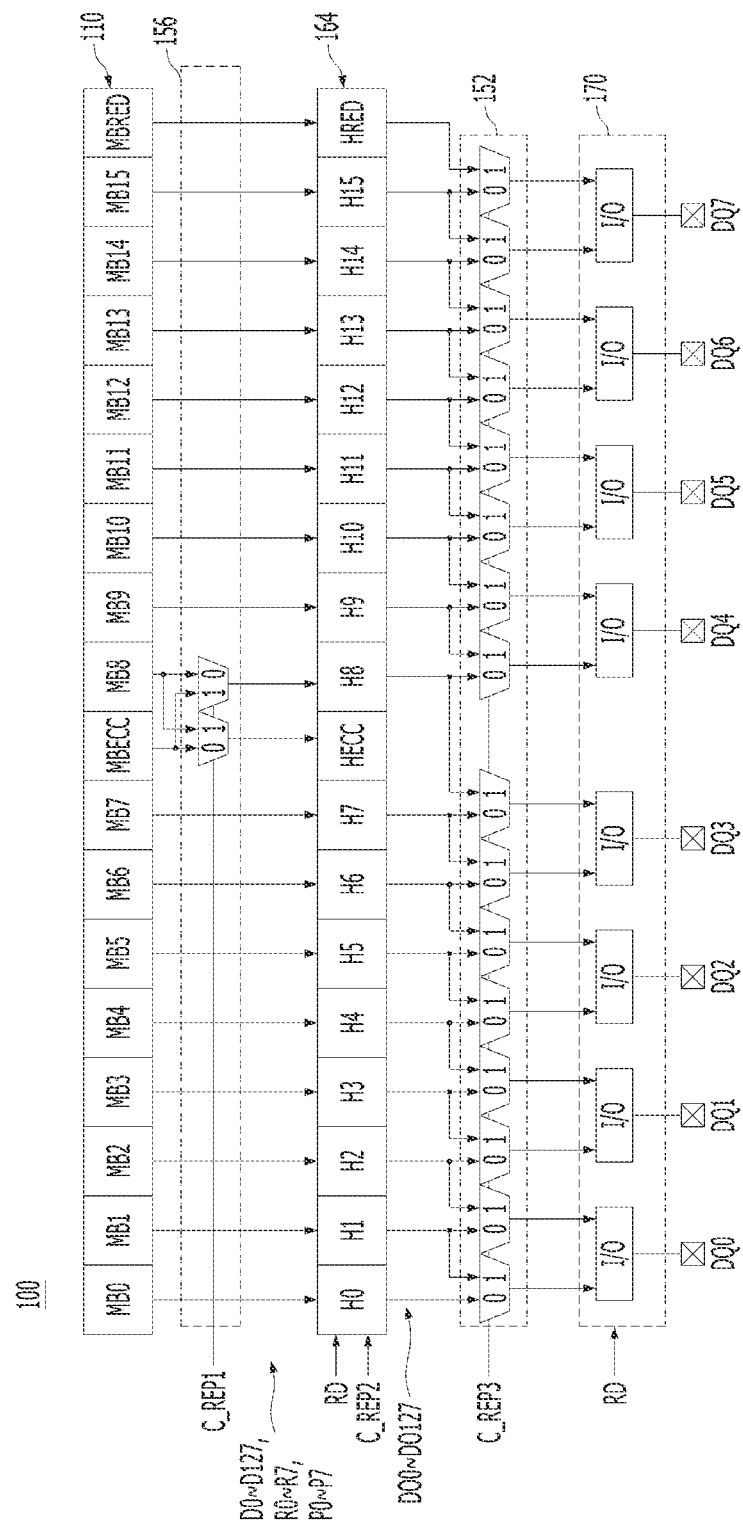
FIGS. 14A and 14B are diagrams illustrating the memory device of FIG. 3 in more detail according to another embodiment of the present invention.
Figure 14B:
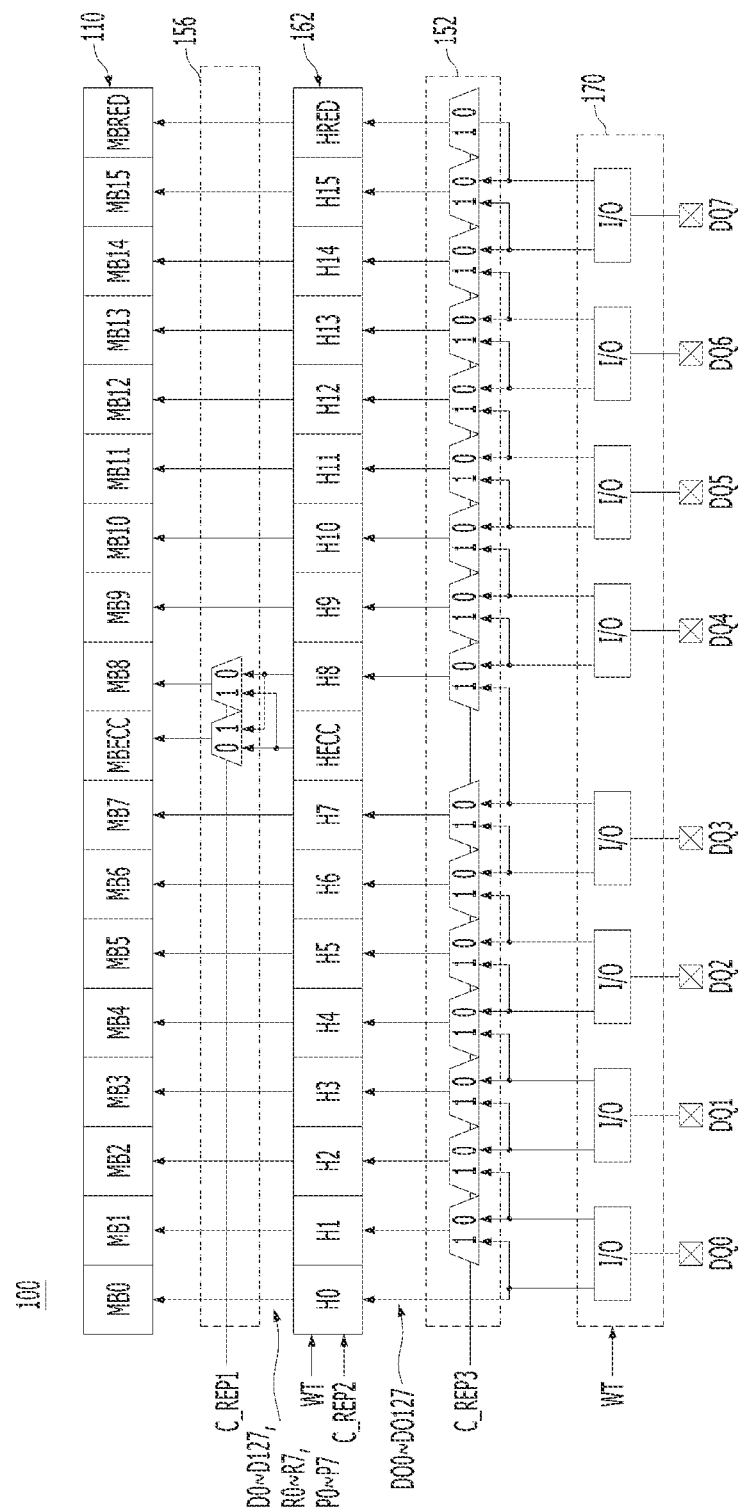

FIGS. 14A and 14B are diagrams illustrating the memory device 100 of FIG. 3 in more detail according to another embodiment of the present invention.

Referring to FIG. 14A, configurations for a read operation of the memory device 100 are illustrated. The configurations shown in FIG. 14A are substantially the same as those shown in FIG. 8A, except that the second switch group 154 is omitted and the error correction circuit 164 of the error correction device 160 may receive the second repair information C_REP2 to perform a zero-padding operation.

Referring to FIG. 14B, configurations for a write operation of the memory device 100 are illustrated. Similarly, the configurations shown in FIG. 14B are substantially the same as those shown in FIG. 8B, except that the second switch group 154 is omitted and the error correction code generation circuit 162 of the error correction device 160 may receive the second repair information C_REP2 to perform a zero-padding operation.

Figure 15:
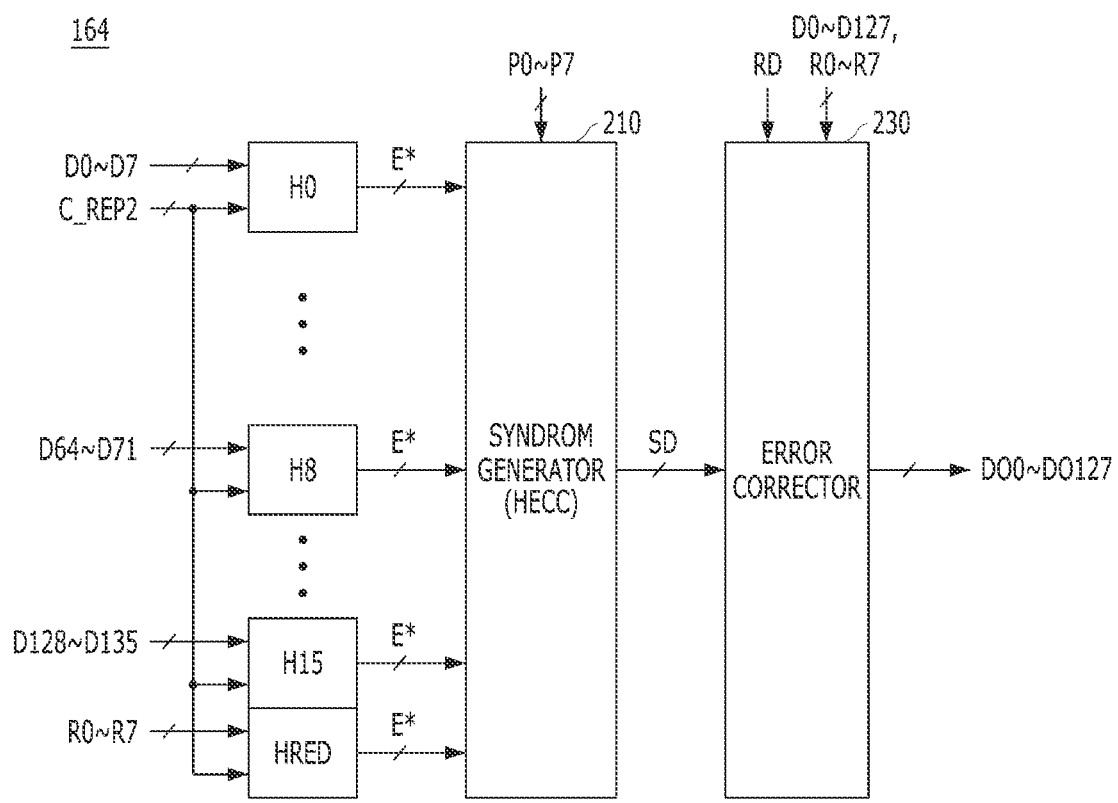
FIG. 15 is a detailed configuration diagram illustrating an error correction device of FIGS. 14A and 14B according to an embodiment of the present invention.

FIG. 15 is a detailed configuration diagram illustrating the error correction device 160 of FIGS. 14A and 14B according to an embodiment of the present invention.

Referring to FIG. 15, the error correction circuit 164 of the error correction device 160 is shown.

The error correction circuit 164 may include a plurality of code calculation circuits, a syndrome generator 210, and an error corrector 230.

For example, the plurality of code calculation circuits may be divided into a plurality of normal code calculation circuits H0 to H15, at least one ECC code calculation circuit HECC, and at least one redundancy code calculation circuit HRED. The ECC code calculation circuit HECC may be included in the syndrome generator 210 in a configuration in which error correction codes P0 to P7 are input. However, the present invention is not limited thereto, and the ECC code operation circuit HECC may be implemented in a separate configuration from the syndrome generator 210.

According to an embodiment, the error correction code generation circuit 162 (see FIG. 7) may include the plurality of code calculation circuits H0 to H15, HECC, and HRED shown in FIG. 15. The code calculation circuits H0 to H15, HECC, and HRED of the error correction circuit 164 and the code calculation circuits H0 to H15, HECC, and HRED of the error correction code generation circuit 162 may be merged into one configuration and implemented.

Each of the normal code calculation circuits H0 to H15 and the redundancy code calculation circuit HRED may generate partial preliminary error correction codes E* based on the corresponding 8-bit data among the data D0 to D127 and R0 to R7 output from the memory cell area 110. In an embodiment of the present invention, the first to eighth normal code calculation circuits H0 to H7, the ECC code calculation circuit HECC, the ninth to 16-th normal code calculation circuits H8 to H15, and the redundancy code calculation circuit HRED may receive respective bits of the second repair information C_REP2 in the order of a lowest bit LSB to a highest bit MSB. Each of the code calculation circuits H0 to H15, HECC, and HRED may perform a zero-padding operation on its calculation result according to a corresponding bit of the second repair control information C_REP2.

The syndrome generator 210 may generate preliminary error correction codes by combining the partial preliminary error correction codes E* provided from the normal code calculation circuits H0 to H15 and the redundancy code calculation circuit HRED, and generate syndrome data SD corresponding to information encoding an error location by comparing the preliminary error correction codes with the error correction codes P0 to P7 by bits.

The error corrector 230 may be activated according to the read command RD to detect error positions of the data D0 to D127 and R0 to R7 based on the syndrome data SD. In this case, 8-bit data among 136-bit data D0 to D127 and R0 to R7 are zero-padded data and are substantially invalid. The error corrector 230 may decode the syndrome data SD to generate information indicating the error location information of the data D0 to D127 and R0 to R7, and may correct the errors of the data D0 to D127 and R0 to R7 based on the information to output the error-corrected data DO0 to DO127.

FIG. 16 is a circuit diagram for describing any one code calculation circuit of FIG. 15 according to an embodiment of the present invention. Since the code operation circuits H0 to H15 and HRED have substantially the same configuration, the first normal code operation circuit H0 will be described as an example.

Referring to FIG. 16, the first normal code calculation circuit H0 may include a preliminary code calculation unit 310 and a zero-padding switch 320.

The preliminary code operator 310 may generate preliminary codes PRE1 to PRE4 by comparing some bits of the data D0 to D7. The preliminary code operator 310 may include first to tenth XOR gates XR1 to XR10. The first to sixth XOR gates XR1 to XR6 may perform a logic XOR operation on two bits among the data D0 to D7 to output comparison codes X01, X23, X17, X35, X45, and X67. The seventh to tenth XOR gates XR7 to XR10 may perform a logic XOR operation on two codes among the comparison codes X01, X23, X17, X35, X45, and X67 to output the preliminary codes PRE1 to PRE4.

The zero-padding switch 320 may include first to fourth multiplexers M1 to M4 that perform a zero-padding operation according to the second repair control information C_REP2. Each of the first to fourth multiplexers M1 to M4 may output some of the partial preliminary error correction codes E* by selecting one of a corresponding preliminary bit of the preliminary codes PRE1 to PRE4, and a low bit, according to the LSB C_REP2<0> of the second repair control information C_REP2.

For reference, in FIG. 16, the first to fourth multiplexers M1 to M4 may correspond to one of the second switch group 154 of FIG. 8A. The zero-padding switches Z0 to Z16 of FIG. 8A require eight multiplexers corresponding to the number of bits of data, respectively. However, according to the present embodiment, by performing a zero-padding operation after calculating parity bits, the zero-padding switch 320 may perform the zero-padding operation with only four multiplexers. Accordingly, in the present embodiment, the error correction capability may be improved while minimizing an increase in the area due to the zero-padding switches.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of this disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A memory device comprising:
   a memory cell area including a plurality of cell blocks divided into a plurality of normal cell blocks, at least one error correction code (ECC) cell block, and at least one redundancy cell block, the plurality of cell blocks being configured to output data and error correction codes;
   an error correction circuit configured to generate error-corrected data by correcting errors in the data using the error correction codes;
   a first switch group disposed between the error correction circuit and data pads, configured to output the error-corrected data through the data pads while performing, according to first repair control information, a shifting operation on the error-corrected data; and
   a second switch group disposed between the memory cell area and the error correction circuit, configured to transfer the data from the memory cell area to the error correction circuit while performing, according to second repair control information, a zero-padding operation on the data output from one of the cell blocks.

2. The memory device of claim 1, wherein the zero-padding operation is performed prior to the shifting operation on the error-corrected data.

3. The memory device of claim 1, wherein the error correction circuit includes a plurality of code calculation circuits divided into a plurality of normal code calculation circuits, at least one ECC code calculation circuit and at least one redundancy code calculation circuit.

4. The memory device of claim 3,
wherein the first switch group includes a plurality of first switches respectively corresponding to the normal code calculation circuits, and
wherein each of the first switches is configured to select, according to a corresponding bit within the first repair control information, the data output from a corresponding normal code calculation circuit or the data output from an adjacent code calculation circuit to output the selected data.

5. The memory device of claim 1,
wherein the second switch group includes a plurality of second switches respectively corresponding to the normal cell blocks and the redundancy cell block, and
wherein each of the second switches is configured to select, according to a corresponding bit within the second repair control information, the data output from a corresponding one of the normal cell blocks or zero-data to transfer the selected data.

6. The memory device of claim 1, further comprising a third switch group configured to perform, according to third repair control information, a swap operation on the data output from the ECC cell block with the data output from one of the normal cell blocks, which is adjacent to the ECC cell block.

7. The memory device of claim 6, wherein the third switch group includes a first swap switch configured to transfer, to the error correction circuit according to the third repair control information, one of the data output from the ECC cell block and the data output from the adjacent normal cell block.

8. The memory device of claim 7, wherein the third switch group further includes a second swap switch configured to transfer, to the second switch group according to the third repair control information, the other one of the data output from the ECC cell block and the data output from the adjacent normal cell block.

9. The memory device of claim 1, further comprising a repair control circuit configured to store defective addresses as repair information and configured to provide, based on the stored repair information, the first and second repair control information corresponding to an input address.

10. The memory device of claim 9, wherein the repair control circuit includes:
a plurality of address storage circuits respectively corresponding to the normal cell blocks and the ECC cell block and configured to store the defective addresses of the respective blocks and configured to generate a plurality of match signals by comparing the input address with the stored defective addresses;
a shifting control circuit configured to generate a plurality of shifting signals respectively corresponding to the match signals, each shifting signal being activated according to a corresponding match signal or a shifting signal of a previous stage; and
an information generation circuit configured to generate the first and second repair control information according to the match signals and the shifting signals.

11. The memory device of claim 1,
wherein the normal cell blocks are configured by first to 2m-th normal cell blocks, and wherein the first to m-th normal cell blocks, the ECC cell block, the (m+1)-th to 2m-th normal cell blocks, and the redundancy cell block may be sequentially disposed in a row direction.

12. A memory device comprising:
a memory cell area including a plurality of cell blocks divided into a plurality of normal cell blocks, at least one error correction code (ECC) cell block, and at least one redundancy cell block, the plurality of cell blocks being configured to output data and error correction codes;
an error correction circuit including a plurality of code calculation circuits corresponding to the cell blocks and configured to generate error-corrected data by correcting errors in the data using the error correction codes while performing, according to second repair control information, a zero-padding operation on a result of calculating on a part of the data by any one of the code calculation circuits; and
a first switch group disposed between the error correction circuit and data pads, configured to output the error-corrected data through the data pads while performing, according to first repair control information, a shifting operation on the error-corrected data.

13. The memory device of claim 12, wherein the zero-padding operation is performed prior to the shifting operation on the error-corrected data.

14. The memory device of claim 12, wherein the error correction circuit includes:
the plurality of code calculation circuits configured to generate partial preliminary error correction codes based on the data while performing the zero-padding operation according to the second repair control information;
a syndrome generator configured to generate preliminary error correction codes by combining the partial preliminary error correction codes and configured to generate syndrome data by comparing the preliminary error correction codes with the error correction codes; and
an error corrector configured to generate the error-corrected data by correcting, based on the syndrome data, the errors in the data.

15. The memory device of claim 14, wherein each of the code calculation circuits includes:
a preliminary code operator configured to generate preliminary codes by comparing corresponding bits within the data; and
a plurality of zero-padding switches configured to output the partial preliminary error correction codes by selecting, according to a corresponding bit within the second repair control information, one of the preliminary codes and zero data.

16. The memory device of claim 12, wherein the code calculation circuits are divided into a plurality of normal code calculation circuits, at least one ECC code calculation circuit and at least one redundancy code calculation circuit.

17. The memory device of claim 16,
wherein the first switch group includes a plurality of first switches respectively corresponding to the normal code calculation circuits, and
wherein each of the first switches is configured to select, according to a corresponding bit within the first repair control information, the data output from a corresponding normal code calculation circuit or the data output from an adjacent code calculation circuit to output the selected data.

18. The memory device of claim 12, further comprising a third switch group configured to perform, according to third repair control information, a swap operation on the data output from the ECC cell block with the data output from one of the normal cell blocks, which is adjacent to the ECC cell block.

19. The memory device of claim 18, wherein the third switch group includes:
a first swap switch configured to transfer, to the error correction circuit according to the third repair control information, one of the data output from the ECC cell block and the data output from the adjacent normal cell block.

20. The memory device of claim 19, wherein the third switch group further includes a second swap switch configured to transfer, to the error correction circuit according to the third repair control information, the other one of the data output from the ECC cell block and the data output from the adjacent normal cell block.

21. The memory device of claim 12, further comprising a repair control circuit configured to store defective addresses as repair information and configured to provide, based on the stored repair information, the first and second repair control information corresponding to an input address.

22. The memory device of claim 21, wherein the repair control circuit includes:
a plurality of address storage circuits respectively corresponding to the normal cell blocks and the ECC cell block and configured to store the defective addresses of the respective blocks and configured to generate a plurality of match signals by comparing the input address with the stored defective addresses;
a shifting control circuit configured to generate a plurality of shifting signals respectively corresponding to the match signals, each shifting signal being activated according to a corresponding match signal or a shifting signal of a previous stage; and
an information generation circuit configured to generate the first and second repair control information according to the match signals and the shifting signals.

23. A memory device comprising:
a shifting circuit configured to receive user data pieces through data pads from an external device to shift the user data pieces;
a zero-padding circuit configured to generate a zero-padded data piece;
an error-correcting circuit configured to generate an error correction code (ECC) data piece for the zero-padded data piece and the shifted user data pieces;
a swapping circuit configured to swap, with each other, the ECC data piece and the shifted user data piece to be stored in neighboring two among memory blocks; and
the memory blocks arranged in a row and configured to store therein the zero-padded data piece, the shifted user data pieces and the ECC data piece, the memory blocks including a column-repaired memory block that the zero-padded data piece is to be stored in and a redundancy memory block that one of the shifted user data pieces corresponding to the column-repaired memory block is to be stored in,
wherein the shifting circuit is disposed between the error-correcting circuit and data pads, and the zero-padding circuit is disposed between the memory blocks and the error-correcting circuit.

24. The memory device of claim 23,
wherein the swapping circuit is further configured to swap, with each other, the ECC data piece and the user data piece from the neighboring memory blocks,
wherein the zero-padding circuit is further configured to generate a zero-padded data piece for the zero-padded data piece from the column-repaired memory block,
wherein the error-correcting circuit is further configured to error-correct, based on the ECC data piece from the swapping circuit, the zero-padded data piece from the zero-padding circuit and the user data pieces from the memory blocks and the swapping circuit, and
wherein the shifting circuit is further configured to output the error-corrected user data pieces by shifting the error-corrected user data pieces from the error-correcting circuit.

* * * * *